United States Patent
Pu et al.

(10) Patent No.: US 12,439,772 B2
(45) Date of Patent: Oct. 7, 2025

(54) DISPLAY MODULE AND DISPLAY APPARATUS

(71) Applicants: Yunnan Invensight Optoelectronics Technology Co., Ltd., Yunnan (CN); BOE TECHNOLOGY GROUP CO., LTD., Beijing (CN)

(72) Inventors: Chao Pu, Beijing (CN); Shengji Yang, Beijing (CN); Kuanta Huang, Beijing (CN); Pengcheng Lu, Beijing (CN); Xiaochuan Chen, Beijing (CN)

(73) Assignees: Yunnan Invensight Optoelectronics Technology Co., Ltd., Yunnan (CN); BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 18/005,372

(22) PCT Filed: Sep. 24, 2021

(86) PCT No.: PCT/CN2021/120498
§ 371 (c)(1),
(2) Date: Jan. 13, 2023

(87) PCT Pub. No.: WO2023/044828
PCT Pub. Date: Mar. 30, 2023

(65) Prior Publication Data
US 2024/0244881 A1    Jul. 18, 2024

(51) Int. Cl.
*H10K 59/131* (2023.01)
*H10K 59/12* (2023.01)
(Continued)

(52) U.S. Cl.
CPC ....... *H10K 59/1201* (2023.02); *H10K 59/121* (2023.02); *H10K 59/131* (2023.02); *H10K 59/88* (2023.02)

(58) Field of Classification Search
CPC .......................... H10K 59/131; H10K 59/1201
See application file for complete search history.

(56) References Cited

U.S. PATENT DOCUMENTS

2017/0196080 A1    7/2017  Meng et al.
2021/0117066 A1*   4/2021  Wang .................... G06F 3/0446
(Continued)

FOREIGN PATENT DOCUMENTS

| CN | 106908971 A | 6/2017 |
|----|-------------|--------|
| KR | 20190074101 A | 6/2019 |
| TW | 201116171 A | 5/2011 |

OTHER PUBLICATIONS

International Search Report (with English translation) and Written Opinion for corresponding PCT Application No. PCT/CN2021/120498, dated May 9, 2022, 8 pages.

*Primary Examiner* — Douglas M Menz
(74) *Attorney, Agent, or Firm* — Dority & Manning, P.A.

(57) ABSTRACT

A display module has a bonding region, and includes a first bonding component and a second bonding component. The first bonding component includes first test pins and first function pins that are disposed in the bonding region and arranged in a first direction. The second bonding component includes second test pins and second function pins that are disposed in the bonding region and arranged in the first direction. The second test pins and the first test pins are coupled to constitute test pin pairs, the second function pins and the first function pins are coupled to constitute function pin pairs, and the test pin pairs and the function pin pairs constitute a pin row. The first bonding component further includes at least one first dummy pin disposed in the bonding region, and a first dummy pin is located on an outer side of the pin row in the first direction.

20 Claims, 20 Drawing Sheets

(51) Int. Cl.
    *H10K 59/121*     (2023.01)
    *H10K 59/88*     (2023.01)

(56) References Cited

U.S. PATENT DOCUMENTS

2021/0271143 A1*   9/2021   Yang .................... H10K 59/131
2023/0015549 A1     1/2023   Cai et al.

* cited by examiner

DISPLAY MODULE AND DISPLAY APPARATUS

CROSS-REFERENCE TO RELATED APPLICATION

This application is a national phase entry under 35 USC 371 of International Patent Application No. PCT/CN2021/120498, filed on Sep. 24, 2021, which is incorporated herein by reference in its entirety.

TECHNICAL FIELD

The present disclosure relates to the field of display technologies, and in particular, to a display module and a display apparatus.

BACKGROUND

A silicon-based organic light emitting diode (OLED) display apparatus is formed by manufacturing OLED devices on a monocrystalline silicon chip serving as a substrate, and the monocrystalline silicon chip may be manufactured by a well-developed complementary metal oxide semiconductor (CMOS) process. Silicon-based OLED display apparatuses have advantages of high resolution, low power consumption, small volume, light weight and the like, and have been widely used in high-resolution near-eye display devices, such as augmented reality (AR) display devices, virtual reality (VR) display devices, wearable devices, industrial security devices and medical devices.

At present, in the silicon-based OLED display apparatus, a control signal is generally transmitted into a display panel through an external circuit such as a flexible printed circuit (FPC), so as to control the display panel to achieve display. Therefore, the FPC and the display panel need to be bonded together, so that the control signal is transmitted into the display panel.

SUMMARY

In an aspect, a display module is provided. The display module has a bonding region, and the display module includes a first bonding component and a second bonding component. The first bonding component includes a plurality of first test pins and a plurality of first function pins that are disposed in the bonding region and arranged in a first direction. The second bonding component includes a plurality of second test pins and a plurality of second function pins that are disposed in the bonding region and arranged in the first direction. The plurality of second test pins and the plurality of first test pins are coupled to constitute a plurality of test pin pairs, the plurality of second function pins and the plurality of first function pins are coupled to constitute a plurality of function pin pairs, and the plurality of test pin pairs and the plurality of function pin pairs constitute a pin row. The first bonding component further includes at least one first dummy pin disposed in the bonding region, and a first dummy pin of the at least one first dummy pin is located on an outer side of the pin row in the first direction.

In some embodiments, the second bonding component further includes at least one second dummy pin disposed in the bonding region, and a second dummy pin of the at least one second dummy pin is located on an outer side of the pin row in the first direction.

In some embodiments, the display module further includes an adhesive layer disposed in the bonding region. A first test pin of a test pin pair of the plurality of test pin pairs is bonded to a second test pin of the test pin pair by the adhesive layer; a first function pin of a function pin pair of the plurality of function pin pairs is bonded to a second function pin of the function pin pair by the adhesive layer; and the at least one first dummy pin is bonded to the second bonding component by the adhesive layer.

In some embodiments, the second bonding component further includes at least one second dummy pin disposed in the bonding region, and a second dummy pin of the at least one second dummy pin is located on an outer side of the pin row in the first direction. The at least one second dummy pin is bonded to the first bonding component by the adhesive layer.

In some embodiments, the first dummy pin is bonded to the second dummy pin by the adhesive layer, so as to constitute a dummy pin pair.

In some embodiments, an overlapping area between the first dummy pin and the second dummy pin of the dummy pin pair is equal to an overlapping area between the first function pin and the second function pin of the function pin pair.

In some embodiments, a contact area between the first dummy pin and the adhesive layer is greater than or equal to a contact area of the first function pin and the adhesive layer.

In some embodiments, the display module further has a display region, the display region and the bonding region are arranged in a second direction, and the second direction intersects the first direction. An end of the first dummy pin away from the display region is flush with an end of a first function pin of the plurality of first function pins away from the display region.

In some embodiments, an overlapping area between a first test pin and a second test pin of a test pin pair of the plurality of test pin pairs is equal to an overlapping area between a first function pin and a second function pin of a function pin pair of the plurality of function pin pairs.

In some embodiments, a number of the plurality of function pin pairs is greater than a number of the plurality of test pin pairs, and is greater than a number of first dummy pins.

In some embodiments, the plurality of test pin pairs in the pin row are symmetrically distributed.

In some embodiments, every two test pin pairs of the plurality of test pin pairs are coupled to each other to constitute a pin group, and the two test pin pairs of the pin group are adjacent to each other. The plurality of test pin pairs are divided into at least one pin group, and the at least one pin group includes a first pin group and/or a second pin group. The first pin group is located on an outer side of all the function pin pairs of the pin row in the first direction, and a function pin pair of the plurality of function pin pairs is arranged on each of two sides of the second pin group in the first direction.

In some embodiments, a distance between two first test pins of the pin group is equal to a distance between two adjacent first function pins of the plurality of first function pins.

In some embodiments, each test pin pair of the pin group has a first end and a second end that are opposite to each other. The first bonding component further includes a plurality of test patterns, and two test patterns of the plurality of test patterns are respectively coupled to second ends of the two test pin pairs of the pin group. The second bonding component further includes at least one connection pattern, and a connection pattern of the at least one connection pattern is coupled to first ends of the two test pin pairs of the pin group.

In some embodiments, the connection pattern is coupled to two second test pins of the pin group, so as to constitute a one-piece pattern.

In some embodiments, the connection pattern is in a shape of a broken line or a curved line protruding towards a side thereof away from the second ends of the two test pin pairs of the pin group.

In some embodiments, the at least one first dummy pin includes a plurality of first dummy pins, and the at least one pin group includes a plurality of pin groups. A number of function pin pairs located between two adjacent first dummy pins of the plurality of first dummy pins is greater than or equal to a number of function pin pairs located between two adjacent pin groups of the plurality of pin groups.

In some embodiments, a distance between a first dummy pin of the at least one first dummy pin and a first test pin of the plurality of first test pins that are adjacent to each other is equal to a distance between two adjacent first function pins of the plurality of first function pins.

In some embodiments, the first bonding component is a flexible printed circuit, and the second bonding component is a display panel. The flexible printed circuit further includes a plurality of first connection lines. The display module further includes a connector, and the connector is coupled to the plurality of first function pins through the plurality of first connection lines.

In some embodiments, the flexible printed circuit further includes a plurality of second connection lines, and a second connection line of the plurality of second connection lines is coupled to a first test pin of the plurality of first test pins. A length of a first connection line of the plurality of first connection lines is greater than a length of the second connection line or a length of the first dummy pin.

In some embodiments, the flexible printed circuit further includes at least one third connection line, and a third connection line of the at least one third connection line is coupled to a first dummy pin. The length of the first connection line is greater than a length of the third connection line.

In some embodiments, the third connection line and the first dummy pin that are coupled to each other have a same width and constitute a one-piece pattern; and/or a first connection line of the plurality of first connection lines and a first function pin of the plurality of first function pins that are coupled to each other have a same width and constitute another one-piece pattern.

In some embodiments, the display panel is a silicon-based display panel.

In another aspect, a display apparatus is provided. The display apparatus includes the display module according to any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
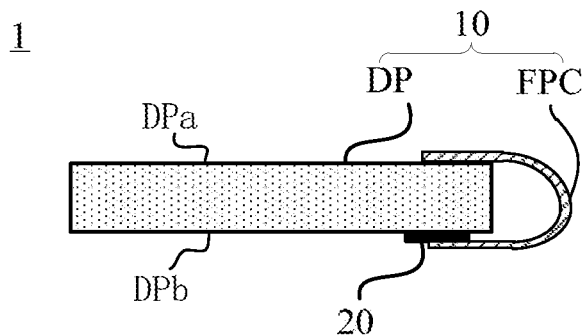
FIG. 1 is a structural diagram of a display apparatus, in accordance with some embodiments.

Technical solutions in some embodiments of the present disclosure will be described clearly and completely below with reference to accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when", "in a case where", "in response to determining that" or "in response to detecting". Similarly, depending on the context, the phrase "if it is determined that" or "if [a stated condition or event] is detected" is optionally construed as "when it is determined that", "in response to determining that", "in a case where [the stated condition or event] is detected" or "in response to detecting [the stated condition or event]".

The phrase "applicable to" or "configured to" as used herein is meant to be open and inclusive, which does not exclude devices that are applicable to or configured to perform additional tasks or steps.

In addition, the phrase "based on" as used herein is meant to be open and inclusive, since a process, a step, a calculation or other action that is "based on" one or more of the stated conditions or values may, in practice, be based on additional conditions or values exceeding those stated.

The term such as "about," "substantially," or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable range of deviation, and the acceptable range of deviation is determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be that, for example, a difference between the two that are equal is less than or equal to 5% of either of the two.

Exemplary embodiments are described herein with reference to cross-sectional views and/or plan views as idealized exemplary drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Embodiments of the present disclosure provide a display apparatus. The display apparatus may be a product with a function of displaying images (which include images in stationary or motion). The images in motion may be videos. For example, the display apparatus may be any one of a display, a television, a billboard, a digital photo frame, a laser printer having a display function, a telephone, a mobile phone, a personal digital assistant (PDA), a digital camera, a portable camcorder, a viewfinder, a navigator, a vehicle, a large-area wall, a home appliance, an information search device (e.g., a business search device for a department of e-government, bank, hospital, electricity or the like), a monitor and the like. The display apparatus may be a micro display or a product including the micro display. The product including the micro display may be any one of a smart watch, a smart wristband, a head-mounted display, a stereoscopic display, an augmented reality (AR) device (e.g., an AR glasses), a virtual reality (VR) device (e.g., a VR glasses) and the like. For example, the micro display may be a display having a display size in a range from approximately 0.2 inches to approximately 2.5 inches, but is not limited thereto. It will be understood that, the micro display may be a display having a smaller display size, which is, for example, less than 0.2 inches.

FIG. 1 is a structural diagram of the display apparatus. Referring to FIG. 1, the display apparatus 1 includes a display module 10 and a motherboard 20.

The motherboard 20 may include an input port (not shown in the figure). The input port is configured to receive a signal (e.g., an electrical signal carrying pixel data of an image to be displayed). The motherboard 20 may further include a signal processing unit (not shown in the figure) coupled to the input port. The signal processing unit includes, for example, a video image signal processing circuit and an internet protocol (IP) converting circuit. The signal processing unit is configured to perform a preset signal processing on the signal received by the input port (e.g., perform a color space conversion, a contrast ratio adjustment or a brightness adjustment on the pixel data of the image to be displayed), and transmit the processed signal to the display module 10.

The display module 10 may include a display panel DP and a circuit board coupled to the display panel DP. The circuit board is further coupled to the motherboard 20. The motherboard 20 is configured to output a signal to the display panel DP through the circuit board. For example, the circuit board is configured to receive the signal transmitted by the motherboard 20 and transmit the received signal to the display panel DP. For another example, the circuit board is configured to receive the signal transmitted by the motherboard 20, perform a signal processing on the received signal, and transmit the processed signal to the display panel DP.

The circuit board may be a common circuit board or a flexible printed circuit (FPC). Since the FPC is flexible, as shown in FIG. 1, the motherboard 20 may be disposed on a back side DPb of the display panel DP (i.e., a side of the display panel DP away from a display surface DPa of the display panel DP), and the display panel DP may be coupled to the motherboard 20 through the bended FPC. In this way, a bezel of the display apparatus 1 may be narrow.

In addition, the display apparatus may further include a housing. The housing is configured to accommodate the display module 10 and the motherboard 20.

Figure 2A:
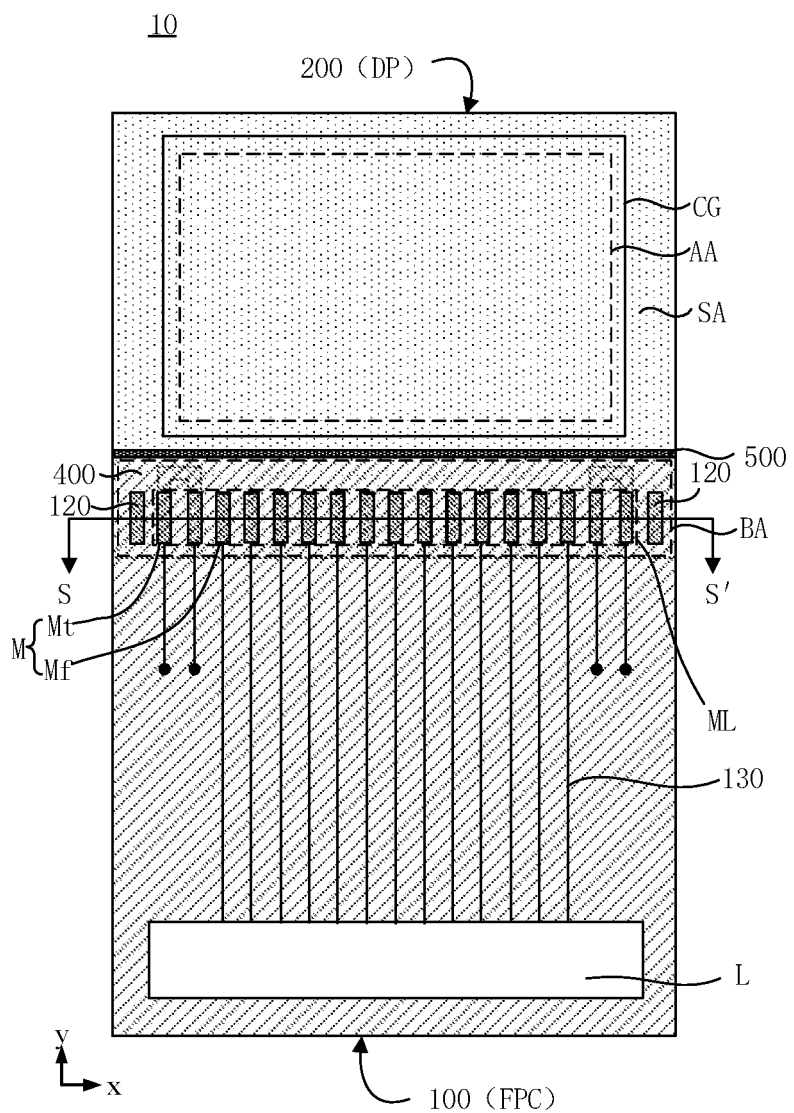
FIG. 2A is a structural diagram of a display module, in accordance with some embodiments.
Figure 2B:
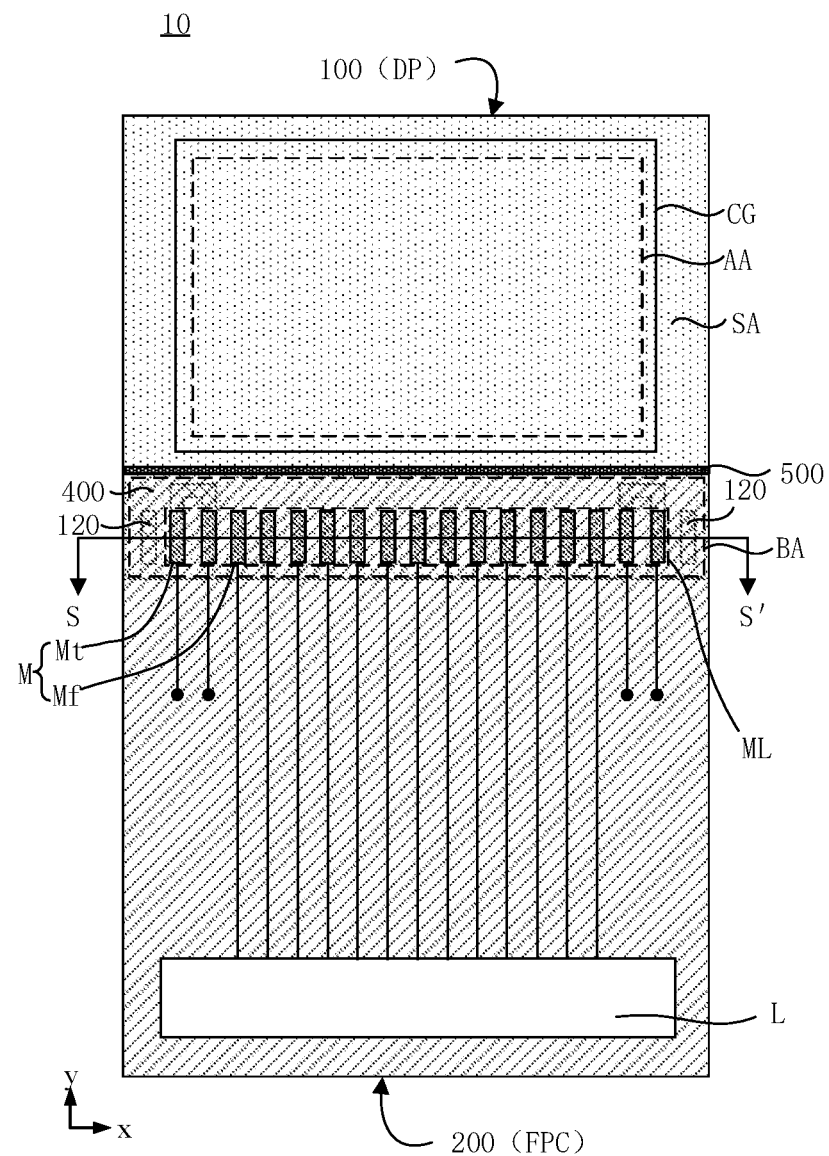
FIG. 2B is a structural diagram of another display module, in accordance with some embodiments.

Some embodiments of the present disclosure provide the display module. FIGS. 2A and 2B each show a structure of the display module. Referring to FIGS. 2A and 2B, the display module 10 may include a first bonding component 100 and a second bonding component 200. One of the first bonding component 100 and the second bonding component 200 is the display panel DP in FIG. 1, and the other is the FPC in FIG. 1.

In some embodiments, referring to FIG. 2A, the first bonding component 100 is the FPC, and the second bonding component 200 is the display panel DP. The signal transmitted by the motherboard 20 may be input into the second bonding component 200 (i.e., the display panel DP) through the first bonding component 100 (i.e., the FPC). In some other embodiments, referring to FIG. 2B, the first bonding component 100 is the display panel DP, and the second bonding component 200 is the FPC. The signal transmitted by the motherboard 20 may be input into the first bonding component 100 (i.e., the display panel DP) through the second bonding component 200 (i.e., the FPC).

Referring to FIGS. 2A and 2B, if display panels are classified into different types according to different display principles, the display panel DP may be an organic light emitting diode (OLED) display panel, a quantum dot light emitting diodes (QLED) display panel, a liquid crystal display (LCD) panel or a micro-sized light-emitting diode (LED) (e.g., a mini LED or a micro LED) display panel. If display panels are classified into different types according to materials of substrates (which may be also referred to as bases) included in the display panels, the display panel may be a common display panel or a silicon-based display panel. A substrate in the common display panel may be glass, polyimide (PI), polyethylene terephthalate (PET) or the like. A substrate in the silicon-based display panel is a silicon substrate such as a monocrystalline silicon substrate.

Figure 3A:
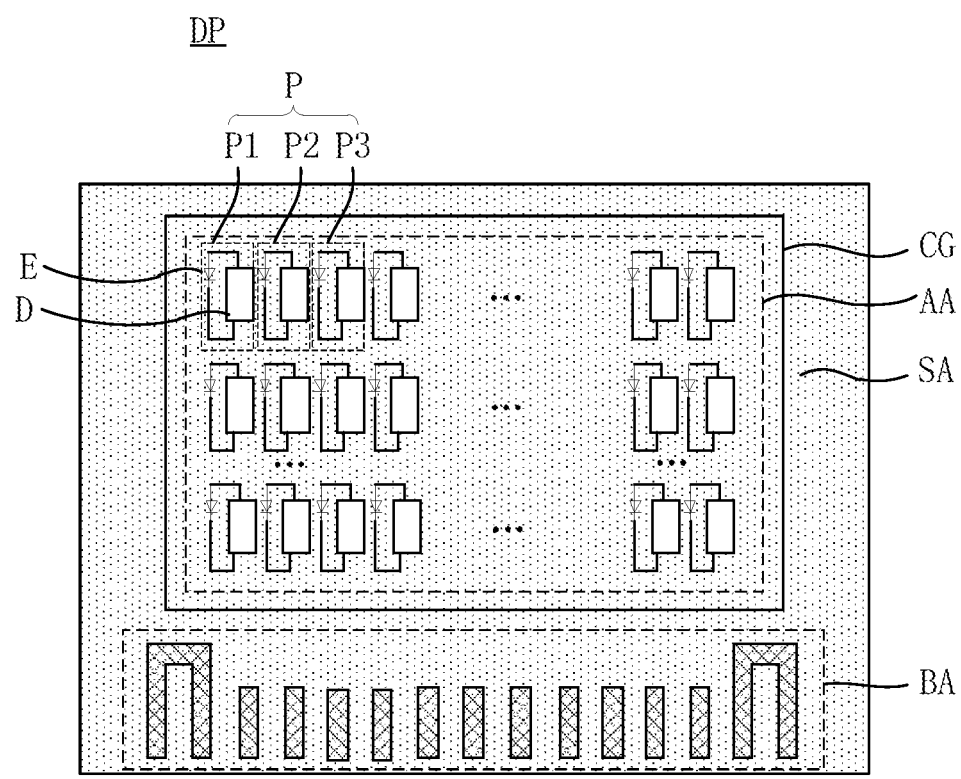
FIG. 3A is a structural diagram of a display panel in a display module, in accordance with some embodiments.

FIG. 3A shows a structure of the display panel DP. Referring to FIG. 3A, the display panel DP may include a display region AA and a peripheral region SA located on at least one side (e.g., one side or all sides (i.e., including an upper side, a lower side, a left side and a right side)) of the display region AA. The display panel DP includes a plurality of sub-pixels P disposed in the display region AA. The plurality of sub-pixels P may include sub-pixels emitting light of different colors. For example, the plurality of sub-pixels P include a first sub-pixel P1, a second sub-pixel P2 and a third sub-pixel P3, and the three respectively emit light of three primary colors. For example, the first sub-pixel P1 may emit red light, the second sub-pixel P2 may emit green light, and the third sub-pixel P3 may emit blue light. Furthermore, a sub-pixel P (e.g., each sub-pixel P) of the plurality of sub-pixels may include a light-emitting device E and a pixel driving circuit D for controlling the light-emitting device E to emit light. The light-emitting device E may be, for example, an OLED, a QLED, a LED or a liquid crystal light-emitting device, but is not limited thereto. The light-emitting device is not limited in the embodiments of the present disclosure. That is, the light-emitting device E may be any other light-emitting device (e.g., a light-emitting device that emits light by discharging), as long as it is capable of emitting light to enable the display apparatus to display images.

In some embodiments, the display panel DP may further include a cover plate. For example, a material of the cover plate may be glass; in this case, the cover plate may be referred to as a cover glass CG as shown in FIG. 2A. The cover glass CG is configured to cover at least the display region AA of the second bonding component 200. In this way, the cover glass CG may protect structures in the display region AA. For example, the cover glass CG may protect the light-emitting devices E disposed in the display region AA.

Figure 3B:
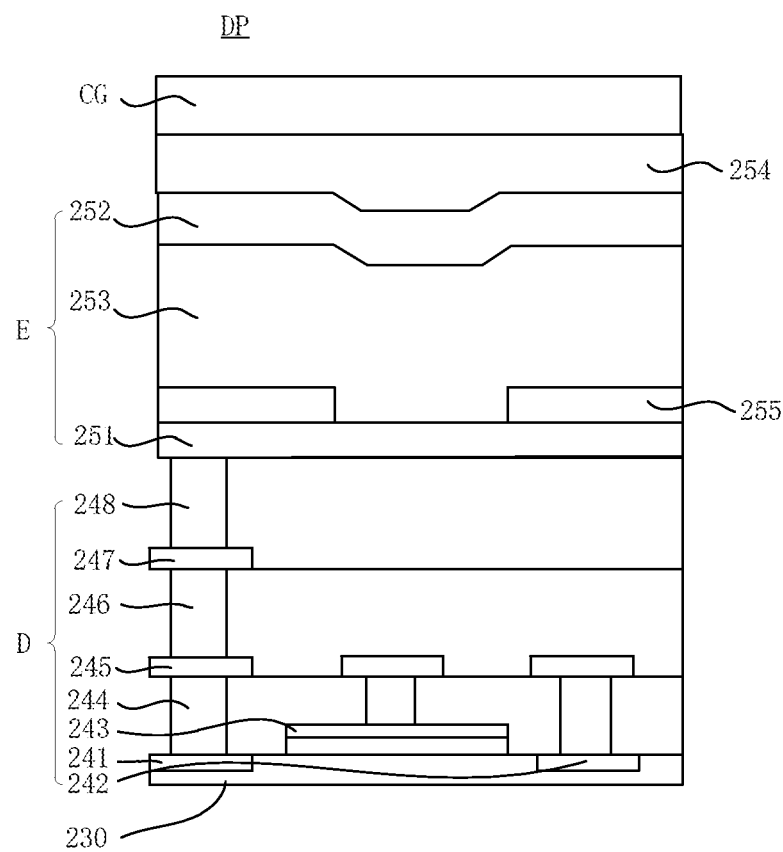
FIG. 3B is a sectional view of partial of the display panel in FIG. 3A.

FIG. 3B is a sectional view of partial of the display panel DP in FIG. 3A, and shows a structure of a sub-pixel. Referring to FIG. 3B, the display panel DP is the silicon-based display panel. The display panel DP may include the silicon substrate 230, and the pixel driving circuit D and the light-emitting device E may be disposed on the silicon substrate 230. The light-emitting device E may include a first electrode 251, a second electrode 252 and a light-emitting function layer 253 disposed between the first electrode 251 and the second electrode 252. For example, the light-emitting device E is a white OLED; in this case, the display panel DP may further include a color filter layer 254 and a pixel definition layer 255. The color filter layer 254 may include a plurality of color filters of different colors. For example, the color filter layer 254 may include a red filter located in the first sub-pixel, a green filter located in the second sub-pixel and a blue filter located in the third sub-pixel. The pixel driving circuit D may include a plurality of transistors (e.g., field-effect transistors) and at least one (e.g., one) capacitor. For example, the pixel driving circuit D may have a structure of "2T1C", "6T1C", "7T1C", "6T2C" or "7T2C". Here, "T" represents a transistor, the number preceding "T" represents the number of transistors, "C" represents a capacitor, and the number preceding "C" represents the number of capacitors. As shown in FIG. 3B, the transistor may include a source 241, a drain 242 and a gate 243. The pixel driving circuit D may further include a first metal pattern 245, a second metal pattern 247 and a plurality of contact holes. The first metal pattern 245 may be coupled to a transistor of the pixel driving circuit through a contact hole 244. The second metal pattern 247 may be coupled to the first metal pattern 245 through a contact hole 246, and may be coupled to the first electrode 251 of the light-emitting device E through a contact hole 248. The contact hole 244, the contact hole 246 and the contact hole 248 may be filled with tungsten or other metals. For example, an electrical signal (e.g., a driving voltage or a driving current) provided by the pixel driving circuit D may be applied to the light-emitting device E through the contact hole 244, the first metal pattern 245, the contact hole 246, the second metal pattern 247 and the contact hole 248.

With continued reference to FIG. 2A, in some embodiments, the FPC may include a plurality of first connection lines 130. A first connection line 130 (e.g., each first connection line 130) of the plurality of first connection lines 130 may be coupled to the motherboard, and signals output by the motherboard may be transmitted to the display panel DP through the first connection lines 130. In some possible implementations, the display module 10 may further include a connector L, and the connector L is configured to be connected to the FPC and the motherboard. For example, the connector L may be coupled to the motherboard, and may be further coupled to the first connection lines 130 of the FPC. In this way, the motherboard and the FPC may be coupled through the connector L.

Figure 4:
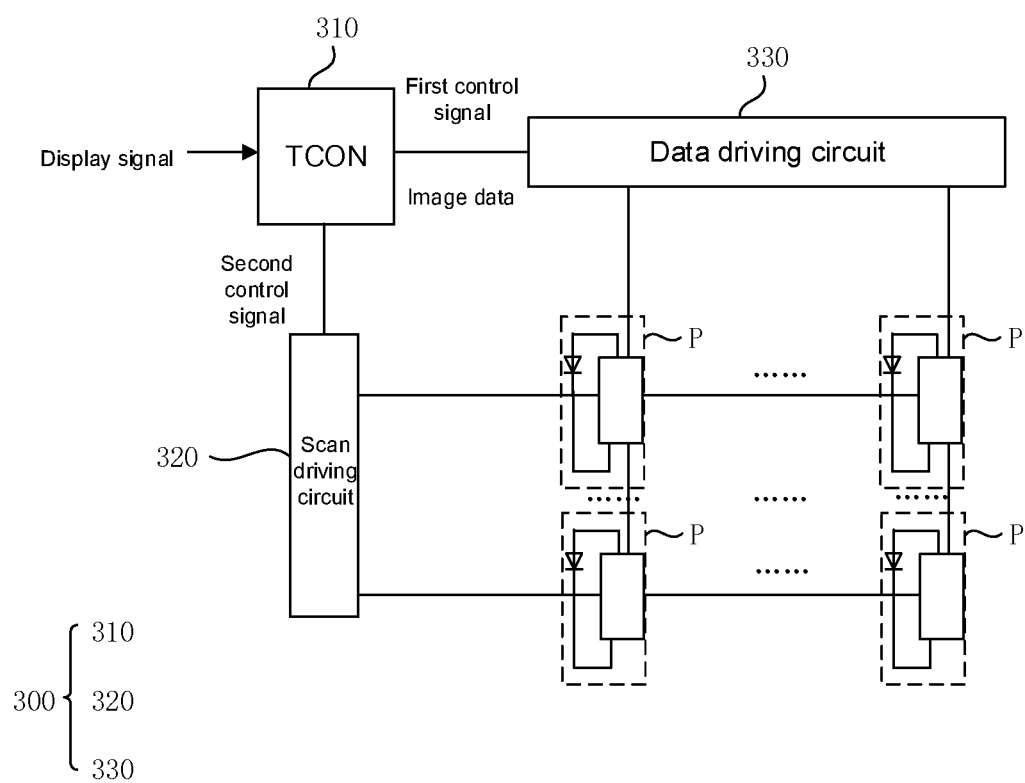
FIG. 4 is a schematic diagram of circuits in a display apparatus, in accordance with some embodiments.

FIG. 4 is a schematic diagram of circuits in the display apparatus. Referring to FIG. 4, the circuits in the display apparatus 1 may include pixel driving circuits of the plurality of sub-pixels P, and the circuits in the display apparatus 1 may further include a driving control circuit 300 coupled to the pixel driving circuits. The driving control circuit 300 is configured to provide scan signals (which may be also referred to as gate scan signals) and data signals (which may be also referred to as data driving signals) for the pixel driving circuits. A pixel driving circuit (e.g., each pixel driving circuit of the plurality of pixel driving circuits) of a sub-pixel P is configured to provide an electrical signal (a driving voltage or a driving current) for a light-emitting device of the sub-pixel P in response to a received scan signal and a received data signal, so as to drive the light-emitting device of the sub-pixel P to emit light (e.g., to control luminance of light emitted by the light-emitting device). Therefore, the display apparatus displays images.

For example, as shown in FIG. 4, the driving control circuit 300 may include a timing control circuit 310 (which may be also referred to as a timer control register, abbreviated as TCON), a scan driving circuit 320 (which may be also referred to as a gate driving circuit) and a data driving circuit 330 (which may be, for example, a source driver integrated circuit (IC)).

The timing control circuit 310 is coupled to the scan driving circuit 320, and is further coupled to the data driving circuit 330. The timing control circuit 310 is configured to receive display signals. The display signals include, for example, a power supply signal, a video image signal, a communication signal (e.g., a signal corresponding to an inter-integrated circuit (IIC) communication protocol) and a mode control signal (e.g., a mode control signal corresponding to a test mode or a mode control signal corresponding to a normal display mode). The video image signal is, for example, a mobile industry processor interface (MIPI) signal or a low-voltage differential signaling (LVDS) signal. The video image signal may include image data and a timing control signal. The image data includes, for example, pixel data of the plurality of sub-pixels, and the pixel data may be red-green-blue (RGB) data. The timing control signal includes, for example, a data enable (DE) signal, a horizontal synchronization (abbreviated as Hsync or HS) signal and a vertical synchronization (abbreviated as Vsync or VS) signal. The timing control circuit 310 is further configured to, in response to the display signals, output a first control signal and the image data to the data driving circuit 330 and output a second control signal to the scan driving circuit 320. The first control signal is configured to control an operation timing of the data driving circuit 330, and the second control signal is configured to control an operation timing of the scan driving circuit 330.

The data driving circuit 330 is configured to convert the received image data into data signals of the plurality of sub-pixels, and output the data signals to pixel driving circuits of corresponding sub-pixels according to the operation timing determined by the first control signal. The scan driving circuit 320 is configured to output scan signals to the plurality of sub-pixels according to the operation timing determined by the second control signal.

According to needs, the circuits shown in FIG. 4 may be integrated in one component of the display apparatus, or may be arranged in some components of the display apparatus.

Figure 5A:
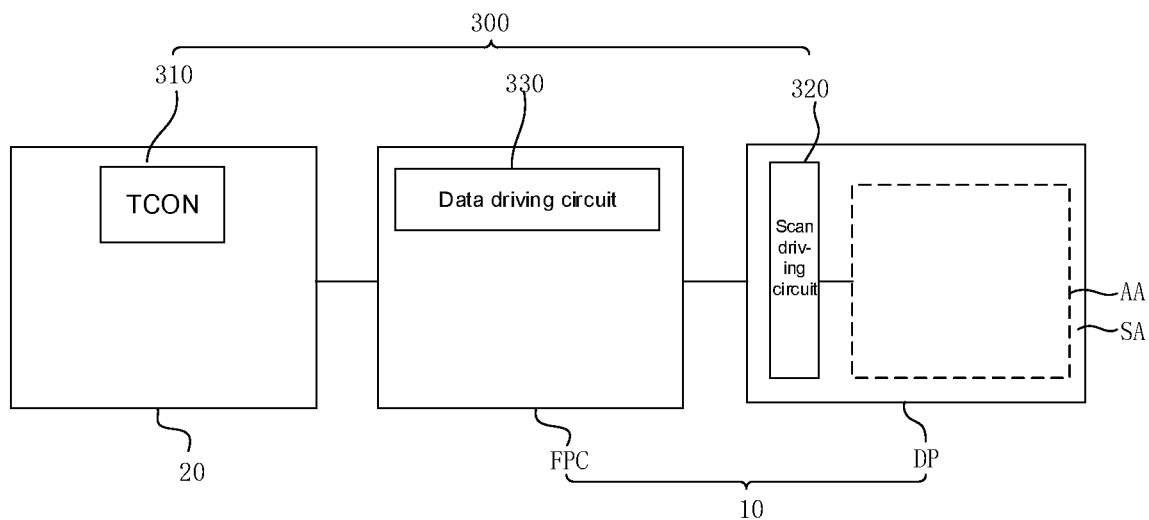
FIG. 5A is a schematic diagram showing a connection relationship of components of a display apparatus, in accordance with some embodiments.

In some embodiments, referring to FIG. 5A, the timing control circuit 310 may be integrated in the motherboard 20, the data driving circuit 330 may be integrated in the FPC, and the scan driving circuit 320 may be integrated in the display panel DP. In this case, the motherboard 20 includes the timing control circuit 310; the FPC includes the data driving circuit 330, and the data driving circuit 330 may be, for example, a driver chip; the display panel DP includes the scan driving circuit 320, and in this case, the scan driving circuit 320 may be referred to as a gate driver on array (GOA).

Figure 5B:
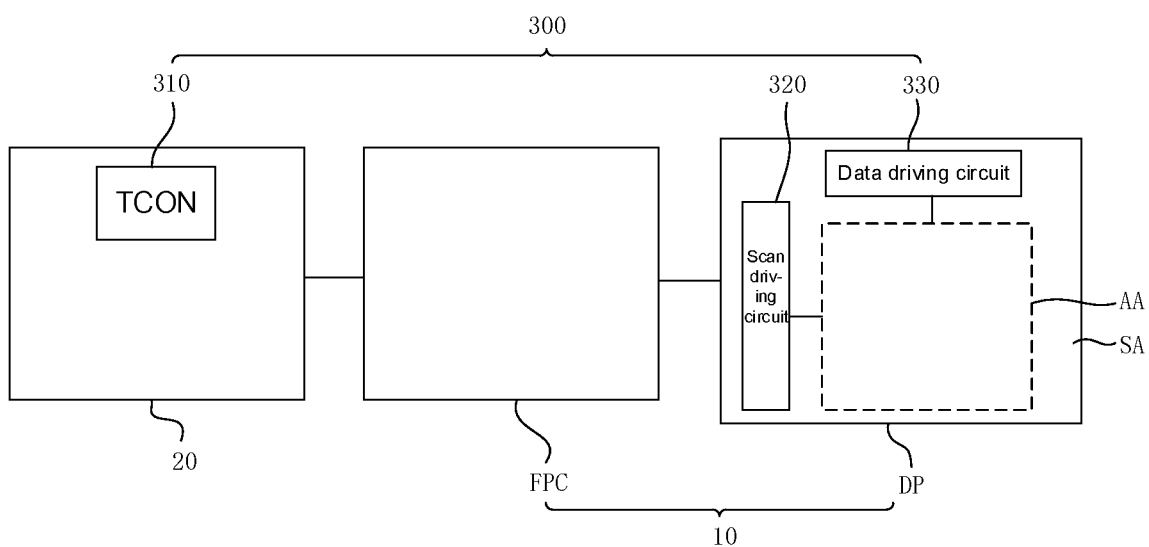
FIG. 5B is a schematic diagram showing a connection relationship of components of a display apparatus, in accordance with some other embodiments.

In some other embodiments, referring to FIG. 5B, the timing control circuit 310 may be integrated in the motherboard 20, and the data driving circuit 330 and the scan driving circuit 320 may be integrated in the display panel DP. In this case, the motherboard 20 includes the timing control circuit 310, and the display panel DP includes the data driving circuit 330 and the scan driving circuit 320. For example, the data driving circuit 330 may be a driver chip. Similarly, since the scan driving circuit 320 is included in the display panel DP, the scan driving circuit 320 may be referred to as a GOA.

Figure 5C:
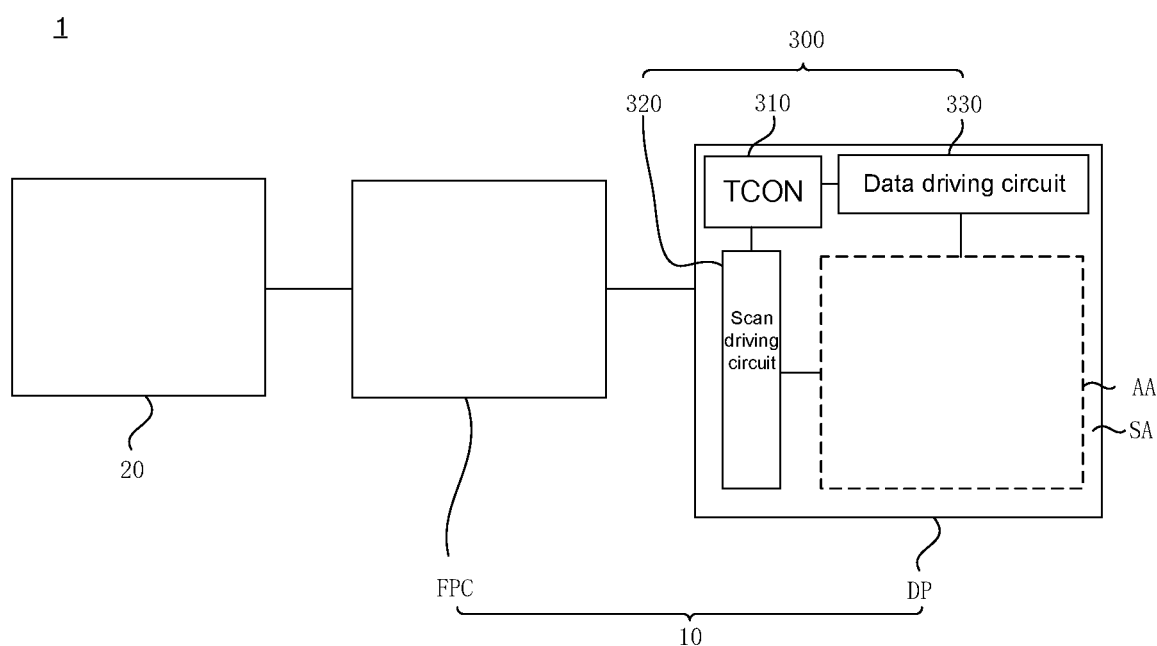
FIG. 5C is a schematic diagram showing a connection relationship of components of a display apparatus, in accordance with yet some other embodiments.

In some other embodiments, referring to FIG. 5C, the timing control circuit 310, the scan driving circuit 320 and the data driving circuit 330 are all integrated in the display panel DP. In this case, the display panel DP includes the timing control circuit 310, the scan driving circuit 320 and the data driving circuit 330. In some possible implementations, referring to FIGS. 3B and 5C, the display panel DP may be the silicon-based display panel. As described above, in a case where the display panel DP is the silicon-based display panel, the display panel DP may include the silicon substrate 230, which is, for example, the monocrystalline silicon substrate. The silicon substrate 230 may serve as an active driving backplane, and complementary metal-oxide-semiconductor (CMOS) driving circuits may be integrated in the silicon substrate 230. For example, the pixel driving circuits D may be directly manufactured on the silicon substrate 230. Alternatively, the timing control circuit 310, the scan driving circuit 320 and the data driving circuit 330 may be all directly manufactured on the silicon substrate 230, so that the timing control circuit 310, the scan driving circuit 320 and the data driving circuit 330 may be all integrated in the display panel DP. In this way, a size of the display module 10 may be smaller. For example, as shown in FIG. 5C, the timing control circuit 310, the scan driving circuit 320 and the data driving circuit 330 may be disposed in the peripheral region SA of the display panel DP.

Hereinafter, the embodiments of the present disclosure are described by taking an example in which the first bonding component is the FPC and the second bonding component is the display panel DP (i.e., the structure shown in FIG. 2A) unless otherwise specified. It will be understood that, in a case where the first bonding component is the display panel DP and the second bonding component is the FPC (i.e., the structure shown in FIG. 2B), the display module and the display apparatus may achieve the same functions as they do in the case where the first bonding component is the FPC and the second bonding component is the display panel DP.

With continued reference to FIGS. 2A and 2B, the first bonding component 100 and the second bonding component 200 may be bonded together by a bonding process, so as to form the display module 10. The first bonding component 100 and the second bonding component 200 that are bonded together are adhered and coupled to each other.

As shown in FIGS. 2A and 2B, the display module 10 may have a bonding region BA. The first bonding component 100 and the second bonding component 200 may be bonded together in the bonding region BA. That is, the first bonding component 100 and the second bonding component 200 may be adhered and coupled to each other in the bonding region BA. As mentioned above, the second bonding component 200 has the display region AA, and correspondingly, the display module 10 may also have the display region AA. The bonding region BA and the display region AA may be arranged in a second direction. The second direction is, for example, a direction in which a y-axis extends. Furthermore, it may be also described as that, the second bonding component 200 and the first bonding component 100 are arranged in the second direction and overlap in the bonding region BA.

Figure 6A:
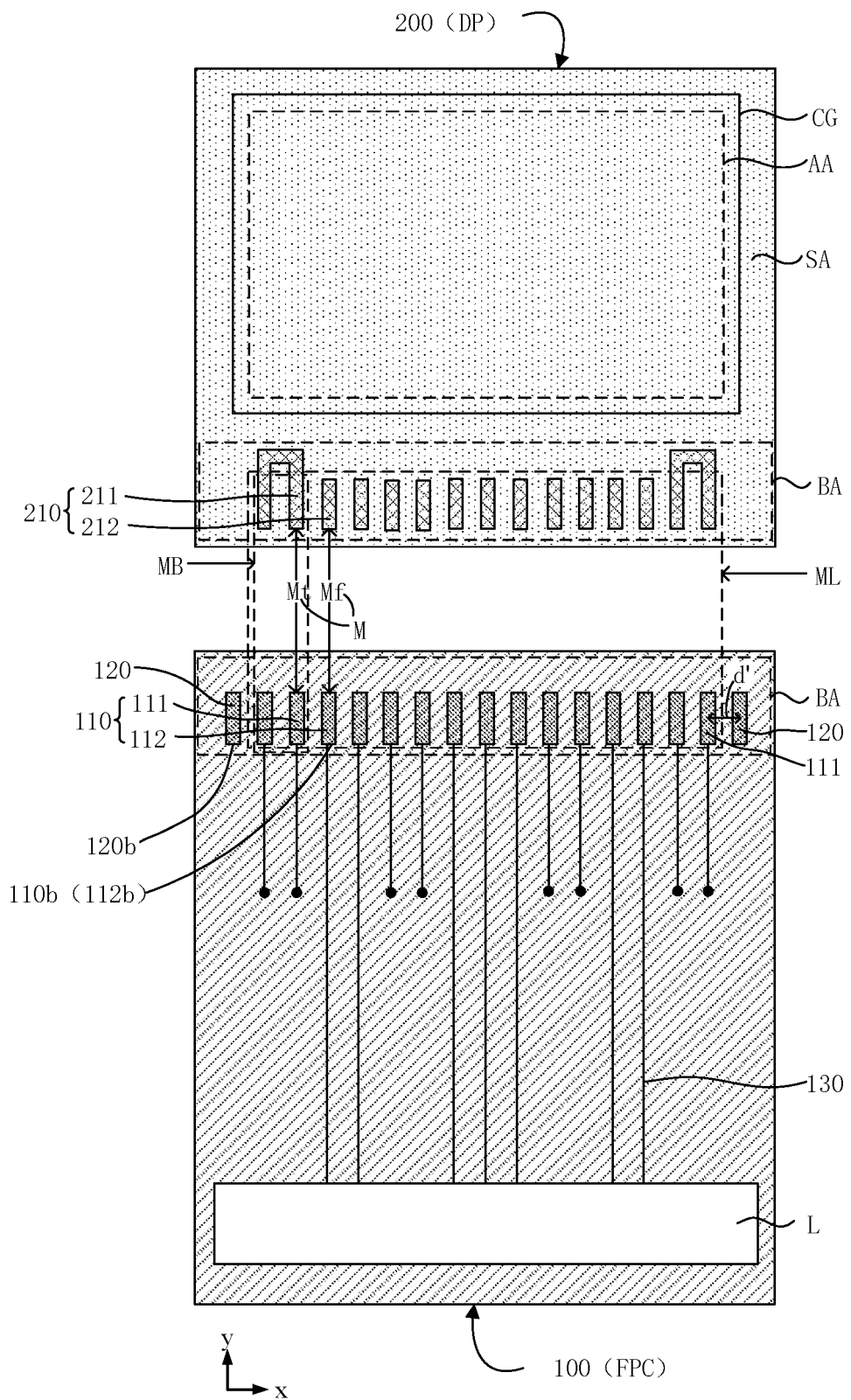
FIG. 6A is a structural diagram of yet another display module, in accordance with some embodiments.

Referring to FIG. 6A, the first bonding component 100 and the second bonding component 200 of the display module 10 in FIG. 2A are separated for an illustration. The bonding region BA may be located at an end, which is proximate to the second bonding component 200, of two ends of the first bonding component 100 in the second direction. The first bonding component 100 may include a plurality of first connection pins 110 disposed in the bonding region BA.

The plurality of first connection pins 110 are arranged in a first direction. It will be noted that the first direction and the second direction intersect. For example, referring to FIG. 6A, the first direction may be a direction in which an x-axis extends, and the second direction may be the direction in which the y-axis extends; in this case, the first direction is perpendicular to the second direction.

A material of the first connection pins 110 may be a conductive material. For example, the material of the first connection pins 110 may include gold or copper having a high electrical conductivity.

For the second bonding component 200, the bonding region BA may be located at an end, which is proximate to the first bonding component 100, of two ends of the second bonding component 200 in the second direction. As shown in FIG. 6A, the second bonding component 200 may include a plurality of second connection pins 210 disposed in the bonding region BA. The plurality of second connection pins 210 are arranged in the first direction. A material of the second connection pins 210 may be a conductive material. For example, the material of the second connection pins 210 may be gold or copper having a high electrical conductivity.

Furthermore, as shown in FIG. 6A, a first connection pin 110 (e.g., each first connection pin 110) may be coupled to a second connection pin 210, so as to constitute a pin pair M. Furthermore, the plurality of first connection pins 110 may be respectively coupled to the plurality of second connection pins 210, so as to constitute a plurality of pin pairs M. The first bonding component 100 and the second bonding component 200 may be coupled to each other through the plurality of pin pairs M, so that electrical signals may be transmitted to the second bonding component 200 (e.g., the display panel DP) through the first bonding component 100 (e.g., the FPC).

Figure 6B:
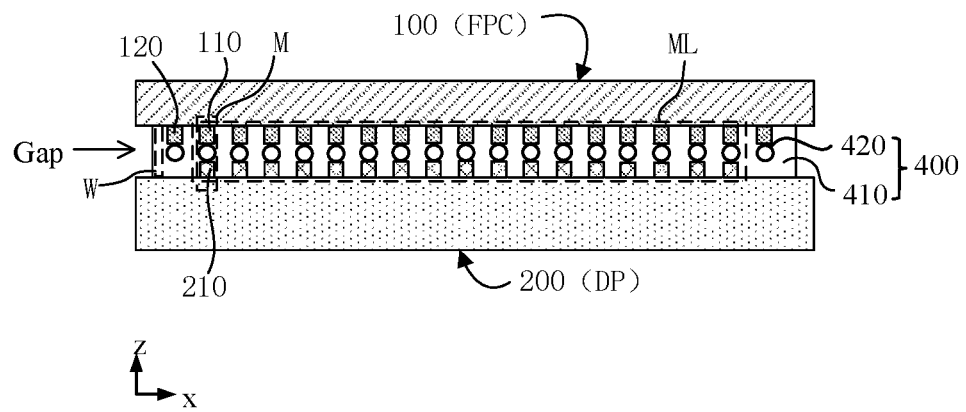
FIG. 6B is a sectional view of the display module in FIG. 2A taken along the section line SS'.

FIG. 6B is a sectional view of the display module in FIG. 2A taken along the section line SS'. In some possible implementations, referring to FIG. 6B, the display module 10 further includes an adhesive layer 400, and a first connection pin 110 (e.g., each first connection pin 110) may be coupled to a second connection pin 210 through the adhesive layer 400, so as to constitute a pin pair M. In the display module 10, the adhesive layer 400 is disposed between the first bonding component 100 and the second bonding component 200 in a thickness direction of the display module 10 (e.g., in a direction in which a z-axis extends, the z-axis being perpendicular to the x-axis and the y-axis). Furthermore, the adhesive layer 400 may be disposed between the first connection pins 110 and the second connection pins 210. The adhesive layer 400 may be an anisotropic conductive adhesive (ACA) layer and include an insulating adhesive 410 and particles 420 dispersed in the insulating adhesive 410. The insulating adhesive 410 has viscidity. A material of the insulating adhesive 410 may include a resin such as a resin adhesive. The particles 420 may be of a core-shell structure. For example, the particle 420 may include a conductive ball that serves as a core and an insulating layer that covers the conductive ball and serves as a shell. In a case where the particle 420 is subjected to an external force such as a pressure in a direction perpendicular to an extending direction of the adhesive layer 400 (i.e., a thickness direction of the adhesive layer 400), a surface (i.e., the insulating layer) of the particle 420 cracks, so that the conductive ball located inside the particle 420 is exposed. The conductive ball may be in contact with both a first connection pin 110 and a second connection pin 210, thereby achieving a directed conductive connection between the first connection pin 110 and the second connection pin 210 in the direction perpendicular to the extending direction of the adhesive layer 400.

It will be noted that, a structure of the adhesive layer 400 shown in FIG. 6B (and FIGS. 9A and 9B) is merely an example. It will be understood that, in the adhesive layer 400, the particles 420 may be uniformly distributed in the insulating adhesive 410. For example, at a position where the pin pair M is located, there may be particles 420 between the first connection pin 110 and the second connection pin 210. For another example, there may be particles 420 at a position near the pin pair M, no pin pair being disposed at the position.

It will be further noted that, the first connection pin 110 and the second connection pin 210 may be coupled in other manners, which is not limited in the embodiments of the present disclosure. For example, the first connection pin 110 may be in contact with the second connection pin 210, so that the first connection pin 110 is coupled to the second connection pin 210. For another example, a conductive structure may be provided between the first connection pin 110 and the second connection pin 210, so that the first connection pin 110 and the second connection pin 210 may be coupled through the conductive structure.

With continued reference to FIG. 6A, the plurality of first connection pins 110 may include a plurality of first test pins 111 and a plurality of first function pins 112 that are arranged in the first direction. Based on the above description, it may be also described as that, the first bonding component 100 includes the plurality of first test pins 111 and the plurality of first function pins 112 that are disposed in the bonding region BA and arranged in the first direction. The first function pins 112 may be configured to be written into the display signals. For example, a first function pin 112 (e.g., each first function pin 112) may be coupled to at least one first connection line 130 (e.g., one or more first connection lines 130); for example, a single first function pin 112 may be coupled to a single first connection line 130. In this way, the display signals output by the motherboard may be written into the first function pins 112 through the first connection lines 130. The first test pins 111 may be each configured to be written into a test signal. An impedance (e.g., a resistance) of a pin pair M may be detected by the test signal.

Correspondingly, the plurality of second connection pins 210 may include a plurality of second test pins 211 and a plurality of second function pins 212 that are arranged in the first direction. Based on the above description, it may be also described as that, the second bonding component 200 includes the plurality of second test pins 211 and the plurality of second function pins 212 that are disposed in the bonding region BA and arranged in the first direction. The second function pins 212 may be configured to be written into the display signals. For example, the second function pins 212 may be coupled to a circuit (e.g., the driving control circuit or the pixel driving circuits) disposed in the second bonding component 200. Therefore, the display signals may be transmitted to the second bonding component 200 through the second function pins 212, so as to drive the sub-pixels of the second bonding component 200 to emit light. A second test pin 211 (e.g., each second test pin 211) may be configured to be written into a test signal.

A second function pin 212 (e.g., each second function pin 212) may be coupled to a first function pin 112, so as to constitute a function pin pair Mf (as shown in FIG. 6A). Correspondingly, the plurality of second function pins 212 are respectively coupled to the plurality of first function pins 112, so as to constitute a plurality of function pin pairs Mf. Based on the above description, the function pin pairs Mf may be configured to transmit the display signals to the second bonding component 200 (e.g., the display panel DP). For example, electrical signals from the outside of the display module may be input into the second bonding component 200 through the connector L, the first connection lines 130 and the function pin pairs Mf.

A second test pin 211 (e.g., each second test pin 211) may be coupled to a first test pin 111, so as to constitute a test pin pair Mt (as shown in FIG. 6A). Correspondingly, the plurality of second test pins 211 are respectively coupled to the plurality of first test pins 111, so as to constitute a plurality of test pin pairs Mt. The test pin pairs Mt may be each configured to detect an impedance (e.g., a resistance) of a pin pair M. For example, an impedance of a function pin pair Mf may be characterized by a detected impedance of a test pin pair Mt.

Based on the above description, the plurality of pin pairs M may include the plurality of test pin pairs Mt and the plurality of function pin pairs Mf. The plurality of test pin pairs Mt and the plurality of function pin pairs Mf constitute a pin row ML (as shown in FIG. 6A).

Furthermore, the first bonding component 100 further includes at least one first dummy pin 120 (e.g., one or more first dummy pins 120) disposed in the bonding region BA. A first dummy pin 120 (e.g., each first dummy pin 120) is located on an outer side of the pin row ML in the first direction. For example, the first bonding component 100 includes a single first dummy pin 120, and the single first dummy pin 120 is located on an outer side of the pin row ML in the first direction. For example, the single first dummy pin 120 is located on an outer side of the pin row ML in a positive direction of the x-axis; for another example, the single first dummy pin 120 is located on an outer side of the pin row ML in a negative direction of the x-axis. For another example, the first bonding component 100 includes first dummy pins 120, and the first dummy pins 120 are located on outer sides of the pin row ML in the first direction. For example, the first dummy pins 120 are all located on the outer side of the pin row ML in the positive direction of the x-axis; for another example, the first dummy pins 120 are all located on the outer side of the pin row ML in the negative direction of the x-axis; for yet another example, at least one (e.g., one or more) of the first dummy pins 120 is located on the outer side of the pin row ML in the positive direction of the x-axis, and the rest of the first dummy pins 120 is located on the outer side of the pin row ML in the negative direction of the x-axis, and in this case, in the first bonding component 100, the two outer sides of the pin row ML in the first direction are each provided with at least one first dummy pin 120 (e.g., one or more first dummy pins 120).

The first dummy pin(s) 120 and the first connection pins 110 may be located in a same conductive layer. The first dummy pin(s) 120 may be made of a metal such as gold or copper. In some embodiments, the first dummy pin(s) 120 and the first connection pins 110 are made of the same material.

Figure 6C:
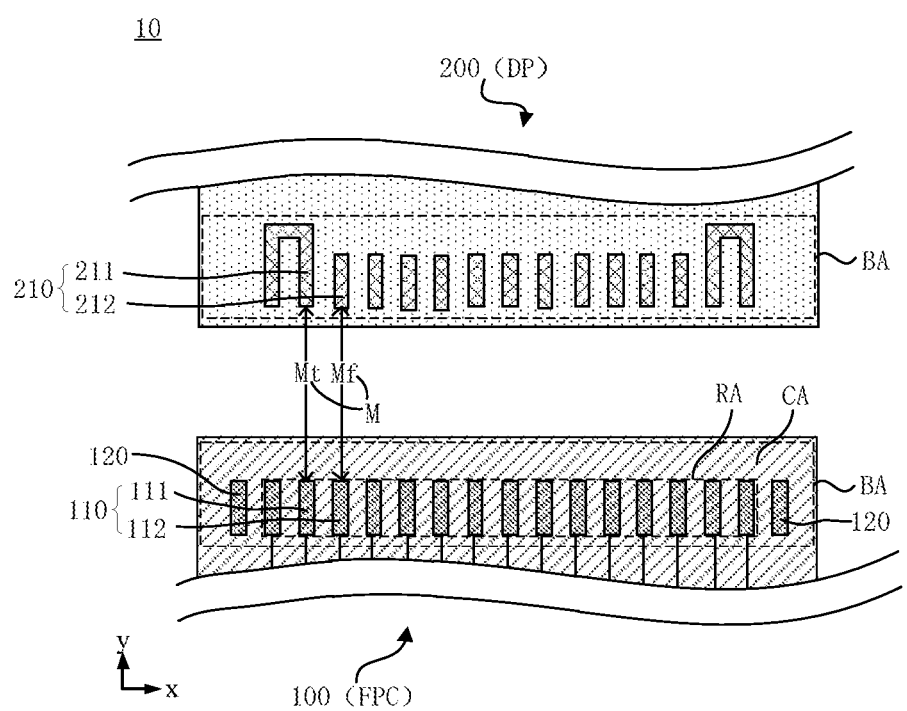
FIG. 6C is a partial enlargement view of the display module in FIG. 6A.

Referring to FIG. 6C, FIG. 6C is a partial enlargement view of the display module in FIG. 6A and shows a structure of the display module in the bonding region. In a process of manufacturing the first bonding component 100, a process of forming the plurality of first connection pins 110 may include: forming a conductive film on a base substrate; forming photoresist patterns on a side of the conductive film away from the base substrate; etching the conductive film by using the photoresist patterns as a mask, so as to form the plurality of first connection pins 110; and removing the photoresist patterns. During the process of etching the conductive film, the plurality of first connection pins 110 are required to be formed in the bonding region BA of the first bonding component 100, and a portion of the conductive film located in a remaining region CA (which is referred to as a first remaining region below for a convenience of description) of the base substrate except for a region RA corresponding to the plurality of first connection pins 110 to be formed (which is referred to as a first connection pin region below for the convenience of description) needs to be completely or partially removed. In this way, a density of patterns in the first connection pin region RA and a density of patterns in the first remaining region CA are different, which causes a large difference between an amount of conductive materials that need to be removed by etching per unit area in the first connection pin region RA and an amount of conductive materials that need to be removed by etching per unit area in the first remaining region CA during the same process of etching. As a result, it is difficult to control uniformities in thicknesses and dimensions of the first connection pins 110 due to a poor selectivity of the process of etching.

In order to ameliorate the above problem, in the display module provided in some embodiments of the present disclosure, the first bonding component 100 includes the at least one first dummy pin 120 (e.g., one or more first dummy pins 120) disposed on the outer side(s) of the pin row in the first direction. That is, the at least one first dummy pin 120 (e.g., one or more first dummy pins 120) is disposed in the first remaining region CA. Therefore, a difference between the density of the patterns in the first connection pin region RA and the density of the patterns in the first remaining region CA may be reduced, which may improve a uniformity of the process of etching, so that the uniformities in the thicknesses and the dimensions of the first connection pins 110 may be improved.

In addition, based on the above description, in the display module 10, the display signals (e.g., the electrical signals) may be transmitted through the function pin pairs Mf, and the display module 10 may display a corresponding picture according to the display signals. Therefore, the impedances (e.g., the resistances) of the function pin pairs Mf may affect the display quality of the display module 10. For example, in the display module 10, a uniformity in impedances of the function pin pairs Mf is crucial for the display effect of the display module 10. As for a pin pair M, an impedance of the pin pair M is related to a resistance of a first connection pin 110 of the pin pair M. In a case where the uniformities in the thicknesses and the dimensions of the first connection pins 110 are improved, a uniformity in resistances of the first connection pins 110 is improved correspondingly, so that the uniformity in the impedances of the function pin pairs Mf in the display module 10 may be improved. On this basis, the first bonding component 100 includes the at least one first dummy pin 120 (e.g., one or more first dummy pins 120) disposed on the outer side(s) of the pin row in the first direction, so that the uniformity in the impedances of the function pin pairs Mf in the display module may be improved. As a result, the display quality of the display module may be improved.

Figure 7A:
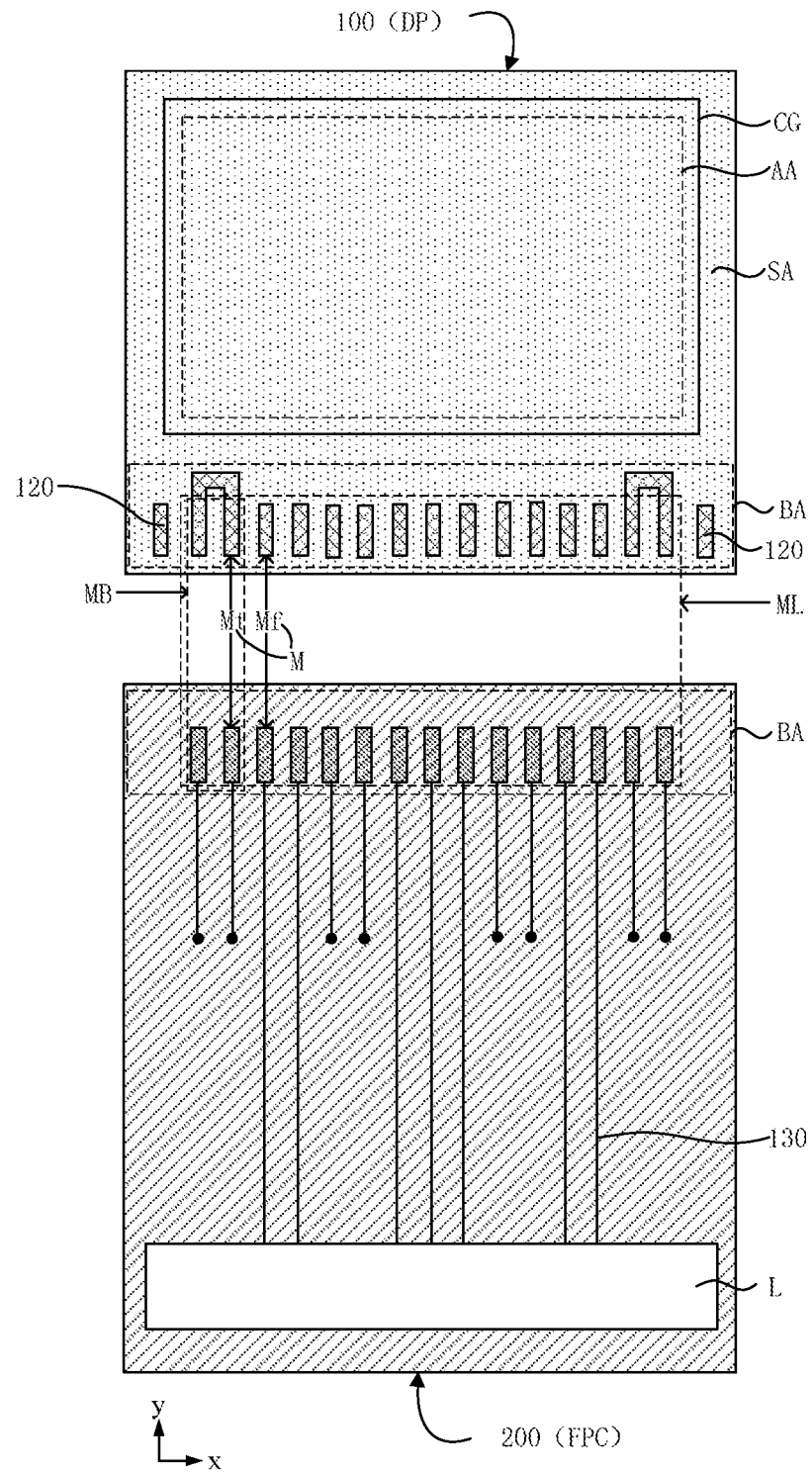
FIG. 7A is a structural diagram of yet another display module, in accordance with some embodiments.
Figure 7B:
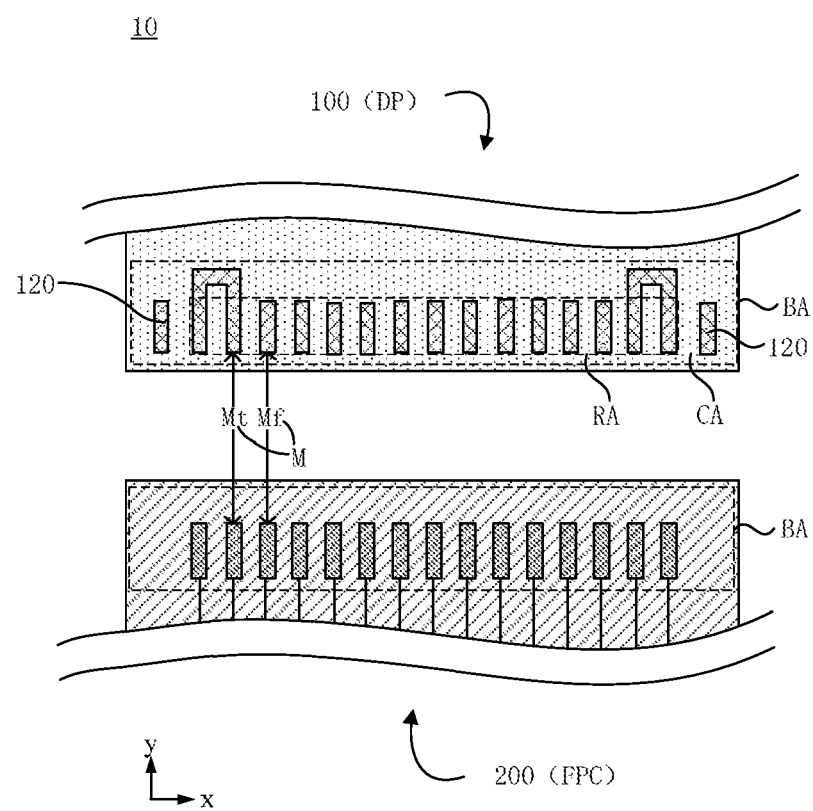
FIG. 7B is a partial enlargement view of the display module in FIG. 7A.

In some embodiments, referring to FIGS. 2A, 6A, 6B and 6C, the first bonding component 100 is the FPC, and the second bonding component 200 is the display panel DP. The first dummy pin(s) 120 may be disposed on the first bonding component 100, i.e., the FPC. In this way, the uniformities in the thicknesses and the dimensions of the first connection pins 110 in the FPC may be improved, and the uniformity in the impedances of the function pin pairs Mf in the display module may be improved to a certain extent, so that the display quality of the display module is improved. In some other embodiments, referring to FIGS. 2B, 7A and 7B, the first bonding component 100 and the second bonding component 200 of the display module 10 in FIG. 2B are separated in FIG. 7A for an illustration; FIG. 7B is a partial enlargement view of the display module 10 in FIG. 7A, and shows the structure of the display module 10 in the bonding region BA. The first bonding component 100 is the display panel DP, and the second bonding component 200 is the FPC. The first dummy pin(s) 120 may be disposed on the first bonding component 100, i.e., the display panel DP. In this way, the uniformities in the thicknesses and the dimensions of the first connection pins 110 in the display panel DP may be improved, and the uniformity in the impedances of the function pin pairs Mf of the display module may be improved to a certain extent, so that the display quality of the display module is improved.

Figure 8A:
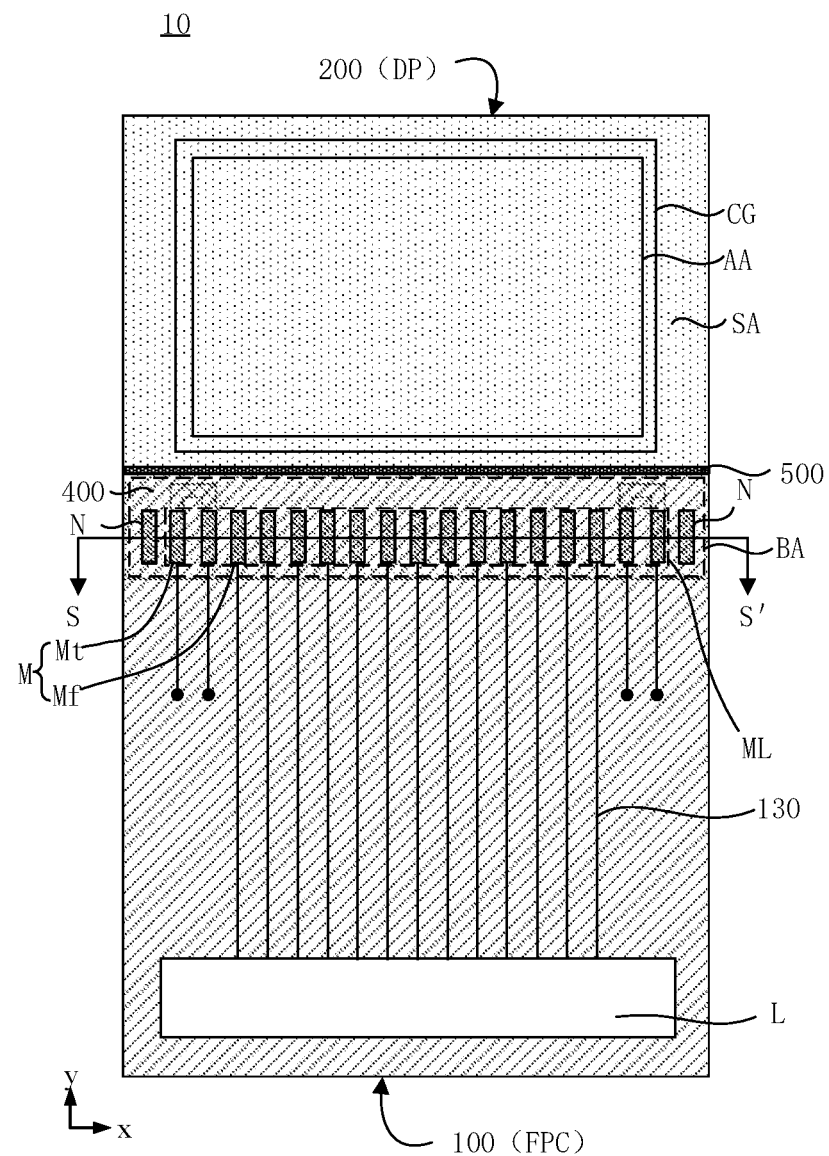
FIG. 8A is a structural diagram of yet another display module, in accordance with some embodiments.
Figure 8B:
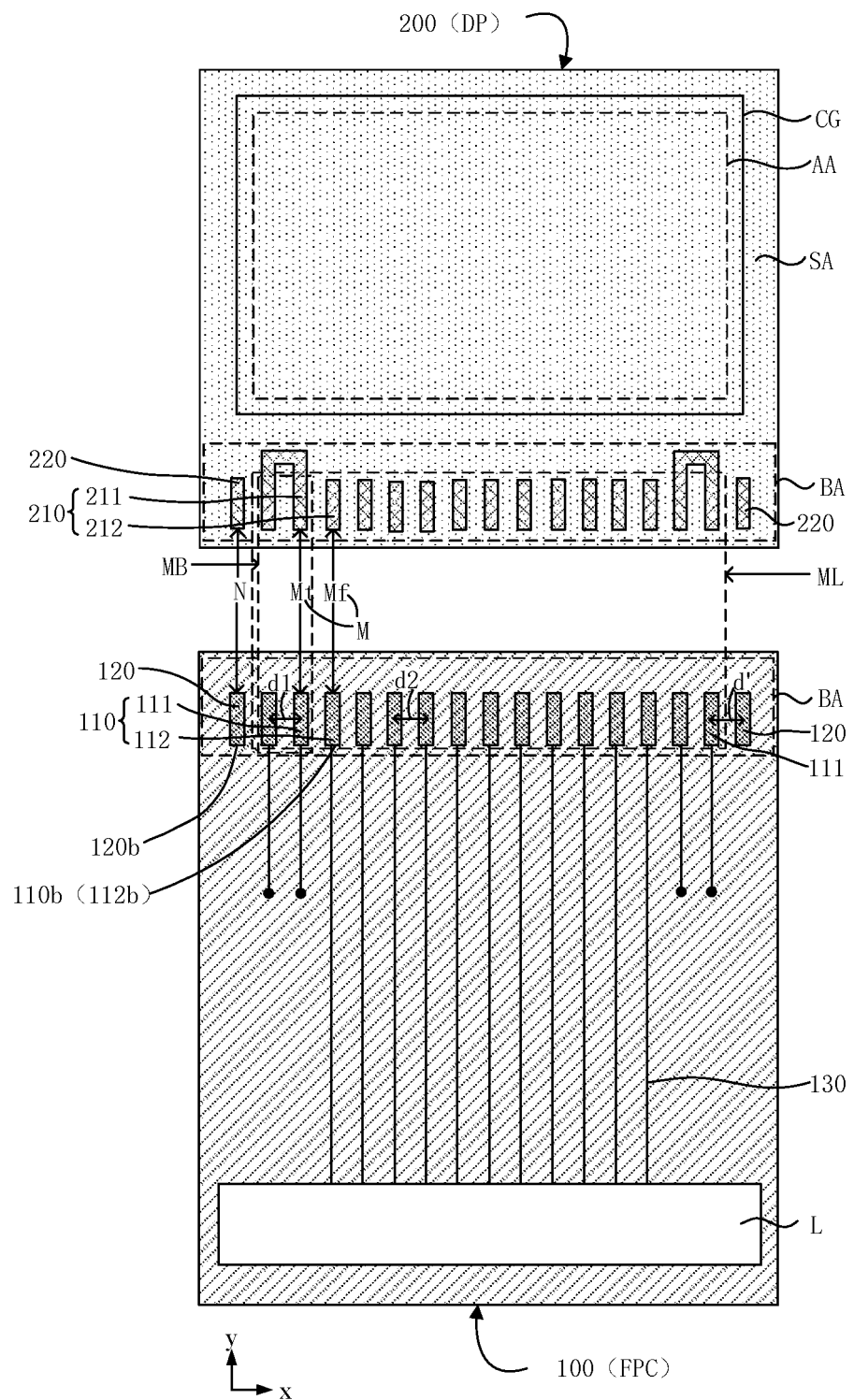
FIG. 8B is a structural diagram of yet another display module, in accordance with some embodiments.

Referring to FIGS. 8A and 8B, the display module 10 in FIG. 8A is separated in FIG. 8B for an illustration. In some embodiments, as shown in FIG. 8B, the second bonding component 200 further includes at least one second dummy pin 220 (e.g., one or more second dummy pins 220) disposed in the bonding region BA. A second dummy pin 220 (e.g., each second dummy pin 220) is located on an outer side of the pin row ML in the first direction. A positional relationship between the second dummy pin(s) 220 and the pin row ML may be similar to a positional relationship between the first dummy pin(s) 120 and the pin row ML, and as for a positional relationship between the second dummy pin(s) 220 and the pin row ML, reference may be made to the above related description, and details will not be repeated here.

The second dummy pin(s) 220 and the second connection pin(s) 210 may be located in a same conductive layer. The second dummy pin 220 may be made of a metal such as gold or copper. In some embodiments, the second dummy pin(s) 220 and the second connection pin(s) 210 are made of the same material.

An effect of the second dummy pin(s) 220 on the second bonding component 200 is similar to an effect of the first dummy pin(s) 120 on the first bonding component 100. That is, the second dummy pin(s) 220 are disposed on the second bonding component 200, so that uniformities in thicknesses and dimensions of the second connection pins 210 of the second bonding component 200 may be improved. Furthermore, the first bonding component 100 includes the first dummy pin(s) 120, and the second bonding component 200 includes the second dummy pin(s) 220. In this way, the uniformities in the thicknesses and the dimensions of both the first connection pins 110 and the second connection pins 210 are improved, a uniformity in impedances of the pin pairs M may be improved, and the display quality of the display module may be further improved.

With continued reference to FIG. 6B, in some embodiments, as described above, the display module 10 may further include the adhesive layer 400. The adhesive layer 400 may be configured to adhere the first bonding component 100 and the second bonding component 200. In addition, as described above, the adhesive layer 400 may be the ACA. In this case, the adhesive layer 400 is configured to adhere the first bonding component 100 and the second bonding component 200, and is further configured to couple the first bonding component 100 and the second bonding component 200.

The adhesive layer 400 is disposed in the bonding region BA. In the display module 10, the adhesive layer 400 is disposed between the first bonding component 100 and the second bonding component 200 in the thickness direction of the display module 10 (e.g., the direction in which the z-axis extends). The material of the adhesive layer 400 has viscidity. For example, the material of the adhesive layer 400 may include a resin such as a resin adhesive.

The adhesive layer 400 may be configured to adhere a first connection pin 110 and a second connection pin 210 that are coupled to each other in a pin pair M (e.g., each pin pair M). That is, the first connection pin 110 may be bonded to the second connection pin 210 by the adhesive layer 400. It will be noted that, the description that A is bonded to B by the adhesive layer (e.g., the description that the first connection pin is bonded to the second connection pin by the adhesive layer, the description that the first dummy pin(s) are bonded to the second bonding component by the adhesive layer, the description that the second dummy pin(s) are bonded to the first bonding component by the adhesive layer, or the description that the first dummy pin is bonded to the second dummy pin by the adhesive layer) herein may mean that, in the thickness direction of the display module (e.g., the direction in which the z-axis extends), A has a portion overlapping B, and a surface, proximate to B, of the portion of A overlapping B is covered by the adhesive layer; correspondingly, B has a portion overlapping A, and a surface, proximate to A, of the portion of B overlapping A is covered by the adhesive layer.

A first test pin 111 of a test pin pair Mt (e.g., each test pin pair Mt) is bonded to a second test pin 211 of the test pin pair Mt by the adhesive layer 400. A first function pin 112 of a function pin pair Mf (e.g., each function pin pair Mf) is bonded to a second function pin 212 of the function pin pair Mf by the adhesive layer 400.

Furthermore, in some embodiments, referring to FIG. 2A, in order to improve an adhesion strength between the first bonding component 100 and the second bonding component 200, the display module 10 may further include an ultraviolet curable adhesive 500 (which may be also referred to as a UV adhesive). For example, the ultraviolet curable adhesive 500 may be disposed at an outer contour of the first bonding component 100 proximate to the display region AA and configured to adhere the first bonding component 100 and the second bonding component 200. The ultraviolet curable adhesive 500 may adhere the second bonding component 200 and at least an edge of the first bonding component 100 proximate to the display region AA.

With continued reference to FIGS. 6A and 6B, based on the above description, in the process of manufacture the display module 10, a process of bonding the first bonding component 100 and the second bonding component 200 may include providing the adhesive layer 400 between the first bonding component 100 and the second bonding component 200, so that the first bonding component 100 and the second bonding component 200 are bonded to each other due to the viscidity of the adhesive layer 400. Furthermore, the adhesive layer 400 is, for example, the ACA; the adhesive layer 400 is hot pressed under certain conditions of temperature, pressure and duration, so that a particle 410 between the first connection pin 110 and the second connection pin 210 of the pin pair M is pressed, a conductive ball inside the particle 410 is exposed, and the conductive ball is in contact with both the first connection pin 110 and the second connection pin 210. In this way, it may be possible to achieve the coupling between the first connection pin 110 and the second connection pin 210 of the pin pair M, and in turn achieve the coupling between the first bonding component 100 and the second bonding component 200 through the pin pairs M.

Based on this, the impedance of the pin pair M (i.e., an impedance between the first connection pin 110 and the second connection pin 210) may include a resistance of the first connection pin 110 and a resistance of the second connection pin 210, and may further include a resistance of a portion of the adhesive layer 400 between the first connection pin 110 and the second connection pin 210. Based on the above description, in the process of bonding the first bonding component 100 and the second bonding component 200, the number of particles 410 in a portion of the adhesive layer 400 corresponding to the pin pair M, a temperature of the portion of the adhesive layer 400 in the bonding process, a degree of cleaning of the first connection pin 110 and/or the second connection pin 210 of the pin pair M, and other factors may all affect the impedance of the pin pair M.

In addition, when the display module or the display apparatus is subjected to an external force in a handling or testing process, the bonding in the bonding region BA of the display module or the display apparatus may be damaged due to the external force, which may affect not only a structural stability of the display module, but also the impedances of the pin pairs M in the bonding region BA. For example, as for a pin pair M, in a case where the pin pair M is subjected to an external force, the portion of the adhesive layer 400 between the first connection pin 110 and the second connection pin 210 of the pin pair M may be damaged and thus has defects. Therefore, a stability of the coupling between the first connection pin 110 and the second connection pin 210 may be damaged, which may cause an increase in the impedance of the pin pair M. For example, the adhesive layer 400 is the ACA, and the defects may damage a contact between the first connection pin 110 and the particles 420 and/or a contact between the second connection pin 210 and the particles 420, which may cause a false connection between the first connection pin 110 and the second connection pin 210, so that the impedance of the pin pair M is increased.

Figure 9A:
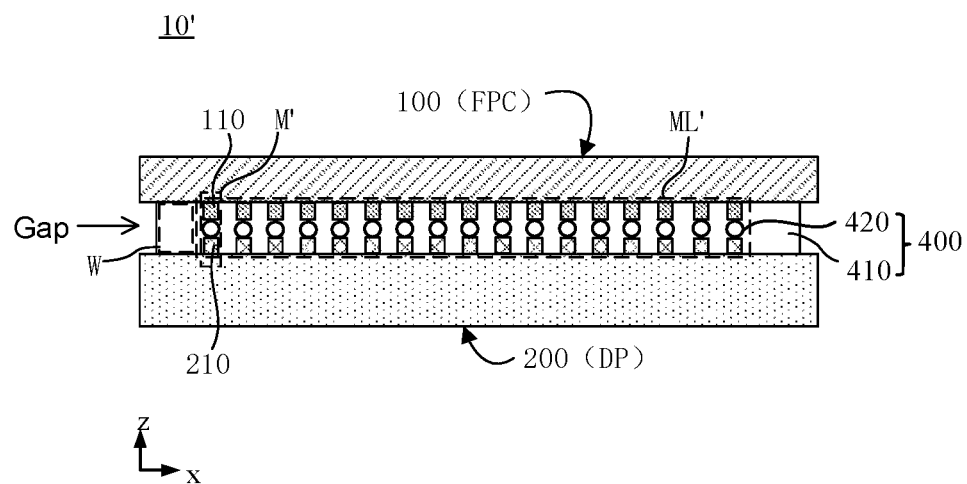
FIG. 9A is a sectional view of a display module in the related art.

The greater the bonding reliability of the pin pair M, the less the damage caused by the external force on the bonding of the pin pair M, and correspondingly, the less the influence of the external force on the impedance of the pin pair M. Referring to FIG. 2A, as described above, in the display module 10, the adhesive layer 400 and the ultraviolet curable adhesive 500 may be configured to adhere the first bonding component 100 and the second bonding component 200. The better the adhesion effect of both the adhesive layer 400 and the ultraviolet curable adhesive 500, the greater the adhesion force of both the adhesive layer 400 and the ultraviolet curable adhesive 500, and the greater the bonding reliability of the pin pairs M. Referring to FIG. 6B, the adhesive layer 400 is disposed only in the bonding region BA, and may not completely cover two ends of the first bonding component 100 in the direction in which the x-axis extends and/or two ends of the second bonding component 200 in the direction in which the x-axis extends. On this basis, due to a process limitation, the two ends of the first bonding component 100 in the direction in which the x-axis extends and/or the two ends of the second bonding component 200 in the direction in which the x-axis extends may not be completely coated with the ultraviolet curable adhesive 500. In this case, as shown in FIG. 6B, gaps may exist at the two ends of the first bonding component 100 in the direction in which the x-axis extends and/or the two ends of the second bonding component 200 in the direction in which the x-axis extends. As a result, in the related art, as shown in FIG. 9A, if no dummy pin is provided on an outer side of a pin row ML' in the first direction, the bonding reliability of a pin pair M' located at an end of the pin row ML' is poor. A description that a pin pair M is located at an end of the pin row ML means that, there is no pin pair located at one of two sides of the pin pair in the first direction, and it may also be described as that, remaining pin pairs of the pin pairs of the pin row ML except the pin pair M are all located at the other of the two sides of the pin pair in the first direction.

In addition, since an adhesion force between the adhesive layer 400 and a metal material may be greater than an adhesion force between the adhesive layer 400 and other material, between the first bonding component 100 and the second bonding component 200, adhesion forces of portions of the adhesive layer 400 at positions where the pins (e.g., including the first connection pins and the second connection pins) are located are greater than an adhesion force of a portion of the adhesive layer 400 at a position where no pin is provided. For example, adhesion forces of portions of the adhesive layer 400 at positions where the pin pairs M are provided are greater than the adhesion force of the portion of the adhesive layer 400 at the position W where no pin is provided (as shown in FIG. 6B). As for the pin pair M located at the end of the pin row ML, if no pin pair is provided on one of the two sides of the pin pair M in the first direction, the bonding reliability of the pin pair M located on the end of the pin row ML is poor. For example, FIG. 9A shows a structure of a display module 10' in the related art, a pin pair M' is located at an end of the pin row ML' (i.e., an end of the pin row ML' in the negative direction of the x-axis), and no pin exists at a side of the pin pair M' in the negative direction of the x-axis, which results in a poor bonding reliability of the pin pair M'.

With continued reference to FIG. 2A, in some embodiments, the second bonding component 200 is the silicon-based display panel, the display module 10 including the second bonding component 200 may be referred to as a silicon-based display module, and the display apparatus including the second bonding component 200 may be referred to as a silicon-based display apparatus. A size of the silicon-based display panel may be small, and correspondingly, a size of the silicon-based display module and a size of the silicon-based display apparatus may be both small, which may be, for example, both less than 2.5 inches. In a case where the silicon-based display module or the silicon-based display apparatus is subjected to an external force during a handling or testing process, the external force may have a relatively large influence on a bonding reliability of the bonding region BA of the small-sized silicon-based display module or the small-sized silicon-based display apparatus, so that the above problem of the poor bonding reliability is more serious in the silicon-based display module and the silicon-based display apparatus.

Referring to FIGS. 2A, 6A and 6B, in order to improve the bonding reliabilities of the pin pairs M in the pin row ML, especially the bonding reliability of the pin pair M located at the end of the pin row ML, in the display module provided in the embodiments of the present disclosure, the first bonding component 100 further includes the at least one first dummy pin 120 (e.g., the one or more first dummy pins 120), and the at least one first dummy pin 120 is disposed in the bonding region BA. For example, the at least one first dummy pin 120 is disposed on the portion, which is located in the bonding region BA, of the surface of the first bonding component 100 proximate to the second bonding component 200. In addition, a first dummy pin 120 (e.g., each first dummy pin 120) is bonded to the second bonding component 200 by the adhesive layer 400.

Since the first dummy pin 120 is disposed on the first bonding component 100, and the first dummy pin 120 may be bonded to the second bonding component 200 by the adhesive layer 400, an adhesion force may be generated between the first dummy pin 120 and the second bonding component 200, which may improve the bonding reliability of the pin pair M adjacent to the first dummy pin 120 (i.e., the pin pair M located at the end of the pin row ML). It may also be described as that, the first dummy pin 120 may protect the pin pair M adjacent to the first dummy pin 120, so that the false connection that may exist in a case where the pin pair M is subjected to an external force may be ameliorated. Moreover, in addition to the pin pair M located at the end of the pin row ML, the first dummy pin 120 may further protect pin pair(s) M of the pin row ML that are close to the first dummy pin 120.

In some embodiments, referring to FIGS. 2A and 6A to 6C, the first bonding component 100 is the FPC, and the second bonding component 200 is the display panel DP. The first dummy pin(s) 120 may be provided only in the first bonding component 100, i.e., the FPC. In this case, the first dummy pin(s) may be provided only in the FPC, which may also protect the pin pairs M. In some other embodiments, referring to FIGS. 2B, 7A and 7B, the first bonding component 100 is the display panel DP, and the second bonding component 200 is the FPC. In this case, the first dummy pin(s) 120 may be provided in the first bonding component 100, i.e., the display panel DP.

In some embodiments, referring to FIGS. 8A and 8B, the first bonding component and the second bonding component of the display module in FIG. 8A are separated in FIG. 8B for an illustration. The second bonding component 200 further includes the at least one second dummy pin 220 (e.g., the one or more second dummy pins 220) disposed in the bonding region BA. Similarly to the first dummy pin(s) 120, the at least one second dummy pin 220 may be disposed on the portion, which is located in the bonding region BA, of the surface of the second bonding component 200 proximate to the first bonding component 100. In addition, a second dummy pin 220 (e.g., each second dummy pin 220) is bonded to the first bonding component 100 by the adhesive layer 400.

Since the second dummy pin(s) 220 are provided in the second bonding component 200, and the second dummy pin 220 may be bonded to the first bonding component 100 by the adhesive layer 400, an adhesion force may be generated between the second dummy pin 220 and the first bonding component 100, which may improve the bonding reliability of the pin pair M adjacent to the second dummy pin 220 (i.e., the pin pair M located at the end of the pin row ML). It may also be described as that, the second dummy pin 220 may protect the pin pair M adjacent to the second dummy pin 220, so that the false connection that may exist in the case where the pin pair M is subjected to the external force may be ameliorated. Similarly, in addition to the pin pair M located at the end of the pin row ML, the second dummy pin 220 may further protect the pin pairs M of the pin row ML that are close to the second dummy pin 220.

Figure 9B:
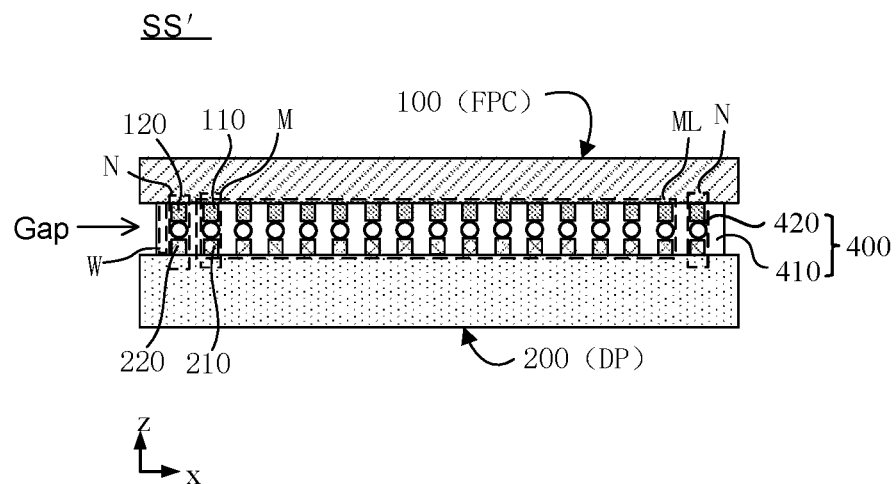
FIG. 9B is a sectional view of the yet another display module in FIG. 8A taken along the section line SS'.

In some embodiments, referring to FIGS. 8A, 8B and 9B, FIG. 9B is a sectional view of the display module in FIG. 8A taken along the section line SS'. A first dummy pin 120 (e.g., each first dummy pin 120) is bonded to a second dummy pin 220 (e.g., each second dummy pin 220) by the adhesive layer 400, so as to constitute a dummy pin pair N. The material of the first dummy pin 120 and the material of the second dummy pin 220 may each include a metal, and as described above, the adhesion force between the adhesive layer 400 and a metal material may be greater than the adhesion force between the adhesive layer 400 and other material. Therefore, compared with a case where the first dummy pin 120 is bonded to other structures of the second bonding component 200 and/or a case where the second dummy pin 220 is bonded to other structures of the first bonding component 100, the first dummy pin 120 and the second dummy pin 220 are bonded to constitute the dummy pin pair N, and an adhesion force of the dummy pin pair N may be relatively great. As a result, it may be possible to further protect a pin pair M adjacent to the dummy pin pair N (i.e., the pin pair M located at the end of the pin row ML), and improve the bonding reliability of the pin pair M.

Similarly, in addition to the pin pair M located at the end of the pin row ML, the dummy pin pair N may further protect pin pairs M of the pin row ML that are close to the dummy pin pair N.

In addition, as for the first dummy pin 120, the larger the contact area between the first dummy pin 120 and the adhesive layer 400, the greater the adhesion force between the first dummy pin 120 and the adhesive layer 400. Similarly, the larger the contact area between the first connection pin 110 and the adhesive layer 400, the greater the adhesion force between the first connection pin 110 and the adhesive layer 400. Based on this, in some embodiments, the contact area between the first dummy pin 120 (e.g., each first dummy pin 120) and the adhesive layer 400 is greater than or equal to the contact area between the first connection pin 110 and the adhesive layer 400.

In some possible implementations, in the display module, the first bonding component 100 includes the first dummy pin(s) 120, and the second bonding component 200 includes no second dummy pin 220. In this case, the first connection pin 110 and the second connection pin 210 in the pin pair M are each in contact with the adhesive layer 400 to create an adhesion force, and only the first dummy pin 120 is in contact with the adhesive layer 400 at a position where the first dummy pin 120 is located. Therefore, when the contact area between the first dummy pin 120 and the adhesive layer 400 is less than or equal to the contact area between the first connection pin 110 and the adhesive layer 400, an adhesion force generated between the adhesive layer 400 and the first dummy pin 120 may be less than the adhesion force generated between the adhesive layer 400 and the pin pair M. In this case, the contact area between the first dummy pin 120 and the adhesive layer 400 may be greater than the contact area between the first connection pin 110 and the adhesive layer 400, so that the adhesion force generated between the adhesive layer 400 and the first dummy pin 120 is approximately equal to the adhesion force generated between the adhesive layer 400 and the pin pair M. In this way, in the case where the display module is subjected to the external force, an overall force on a portion of the display module in the bonding region may be relatively uniform, which may reduce an influence of the external force on the portion of the display module in the bonding region.

Similarly, in some other possible implementations, in the display module, the first bonding component 100 includes the first dummy pin 120, the second bonding component 200 includes the second dummy pin 220, and the first dummy pin 120 and the second dummy pin 220 may constitute the dummy pin pair N. In this case, based on the same principle, the contact area between the first dummy pin 120 and the adhesive layer 400 may be equal to the contact area between the first connection pin 110 and the adhesive layer 400, so that the adhesion force generated between the adhesive layer 400 and the dummy pin pair N is approximately equal to the adhesion force generated between the adhesive layer 400 and the pin pair M. As a result, the overall force on the portion of the display module in the bonding region may be relatively uniform. In addition, since the contact area between the first dummy pin 120 and the adhesive layer 400 may be equal to the contact area between the first connection pin 110 and the adhesive layer 400, an area of the first dummy pin 120 may be equal to an area of the first connection pin 110. In this way, the structure of the first bonding component 100 is simple, which is conducive to improving the yield of products.

In some possible implementations, a contact area between each first connection pin 110 and the adhesive layer 400 is the same, and a contact area between a first dummy pin 120 (e.g., each first dummy pin 120) and the adhesive layer 400 may be greater than or equal to the contact area between each first connection pin 110 and the adhesive layer 400. In some other possible implementations, the contact area between the first dummy pin 120 (e.g., each first dummy pin 120) and the adhesive layer 400 is greater than or equal to a contact area between a first function pin 112 (e.g., each first function pin 112) and the adhesive layer 400. The number of the first function pins 112 of the plurality of first connection pins 110 may be greater than the number of the first test pins 111 of the plurality of first connection pins 110, so that the contact area between the first dummy pin 120 and the adhesive layer 400 is set to be greater than or equal to the contact area between the first function pin 112 and the adhesive layer 400, which may improve the uniformity of the force on the portion of the display module in the bonding region to a certain extend.

Furthermore, a magnitude of the adhesion force generated between the adhesive layer 400 and the dummy pin pair N is related to an overlapping area between the first dummy pin 120 and the second dummy pin 220 of the dummy pin pair N; the greater the overlapping area between the first dummy pin 120 and the second dummy pin 220, the greater the adhesion force generated between the adhesive layer 400 and the dummy pin pair N. Similarly, the adhesion force generated between the adhesive layer 400 and the pin pair M is related to an overlapping area between the first connection pin 110 and the second connection pin 210 of the pin pair M; the greater the overlapping area between the first connection pin 110 and the second connection pin 210, the greater the adhesion force generated between the adhesive layer 400 and the pin pair M. In some embodiments, an overlapping area between the first dummy pin 120 and the second dummy pin 220 of the dummy pin pair N (e.g., each dummy pin pair N) is equal to an overlapping area between the first connection pin 110 and the second connection pin 210 of the pin pair M (e.g., each pin pair M). In this way, when the display module 10 is subjected to the external force, the overall force on the portion of the display module 10 in the bonding region may be relatively uniform, which may reduce the influence of the external force on the portion of the display module in the bonding region. For example, an overlapping area between a first connection pin 110 and a second connection pin 210 of each pin pair M is equal, and an overlapping area between a first dummy pin 120 and a second dummy pin 220 of a dummy pin pair N (e.g., each dummy pin pair N) is equal to the overlapping area between the first connection pin 110 and the second connection pin 210 of each pin pair M. For another example, an overlapping area between the first dummy pin 120 and the second dummy pin 220 of the dummy pin pair N (e.g., each dummy pin pair N) is equal to an overlapping area between the first function pin 112 and the second function pin 212 of a function pin pair Mf (e.g., each function pin pair Mf).

In addition, in order to further improve the uniformity of the force on the portion of the display module in the bonding region, in some embodiments, referring to FIG. 6A, an end 120b of a first dummy pin 120 (e.g., each first dummy pin 120) away from the display region AA is flush with an end 110b of a first connection pin 110 (e.g., each first connection pin 110) away from the display region AA. For example, ends 110b of all of the plurality of first connection pins 110 away from the display region AA are flush with one another; in this case, an end 120b of the first dummy pin 120 (e.g., each first dummy pin 120) away from the display region AA may be flush with the end 110b of each first connection pin 110 away from the display region AA. For another example, referring to FIG. 6A, the end 120b of the first dummy pin 120 (e.g., each first dummy pin 120) away from the display region AA is flush with an end 112b of the first function pin 112 (e.g., each first function pin 112) away from the display region AA. In this way, the uniformity of the force on the portion of the display module in the bonding region may be improved to a certain extend.

With continued reference to FIG. 8B, in the pin row ML, the function pin pairs Mf may be configured to transmit the display signals to the second bonding component 200 (e.g., the display panel DP), and the test pin pair Mt may be configured to detect the impedance (e.g., the resistance) of the pin pair M. As described above, the impedance (e.g., the resistance) of the pin pair M may affect the display effect of the display module 10. For example, in the display module 10, the uniformity in the impedances of the plurality of pin pairs M, especially the uniformity in the impedances of the function pin pairs Mf, is crucial for the display effect of the display module. In order to control the uniformity in the impedances of the function pin pairs Mf, the impedances of the function pin pairs Mf need to be detected. Since the function pin pairs Mf are required to transmit the display signals, the function pin pairs Mf need to be coupled to a circuit (e.g., the driving control circuit) and/or connection lines (e.g., the connection lines 130) for transmitting the display signals. Due to a structural limitation, additionally providing a detection circuit and coupling the detection circuit to the function pin pairs Mf are not conducive to the transmission of the display signals. Based on these, the impedances of the test pin pairs Mt may be used to characterize the impedances of the function pin pairs Mf. By detecting the impedances of the test pin pairs Mt, for example, by providing the detection circuit and coupling the detection circuit to the test pin pairs Mt, the impedances of the function pin pairs Mf are characterized by a detected result of the impedances of the test pin pairs Mt. The above process of detecting the impedances of the test pin pairs Mt and using the impedances of the test pin pairs Mt to characterize the impedances of the function pin pairs Mf may be referred to as a bonding impedance test of the display module. The less the difference between the impedance of the test pin pair Mt and the impedance of the function pin pair Mf, the less the error of the bonding impedance test.

In some embodiments, an overlapping area between a first test pin 111 and a second test pin 211 of a test pin pair Mt (e.g., each test pin pair Mt) is equal to an overlapping area between a first function pin 112 and a second function pin 212 of a function pin pair Mf (e.g., each function pin pair Mf). For example, the overlapping area between the first test pin 111 and the second test pin 211 of each test pin pair Mt is equal to the overlapping area between the first function pin 112 and the second function pin 212 of each function pin pair Mf. That is, an overlapping area between a first connection pin 110 and a second connection pin 210 of each pin pair M of the pin row ML is equal. Based on the above description, the coupling method of the first connection pin 110 and the second connection pin 210 may include that, overlapping portions of the first connection pin 110 and the second connection pin 210 press the adhesive layer 400, so that particles in the adhesive layer 400 crack to expose conductive balls in the particles; the conductive balls are in contact with both the first connection pin 110 and the second connection pin 210, so that a conductive path is formed. Therefore, an overlapping area between the first connection pin 110 and the second connection pin 210 of the pin pair M may affects the impedance of the pin pair M. Under a premise that a contact area between the first connection pin 110 of the pin pair M and the adhesive layer 400 and a contact area between the second connection pin 210 of the pin pair M and the adhesive layer 400 are both constant, if the overlapping area between the first connection pin 110 and the second connection pin 210 is increased, then the impedance of the pin pair M may be reduced. Based on this, in the display module provided in the embodiments of the present disclosure, since the overlapping area between the first test pin 111 and the second test pin 211 of the test pin pair Mt is equal to the overlapping area between the first function pin 112 and the second function pin 212 of the function pin pair Mf, the difference between the impedance of the test pin pair Mt and the impedance of the function pin pair Mf may be less. As a result, the impedances of the test pin pairs Mt can characterize the impedances of the function pin pairs Mf to a great extent, and the error of the bonding impedance test of the display module may be reduced.

In addition, as described above, the adhesion force generated between the adhesive layer 400 and the pin pair M is related to the overlapping area between the first connection pin 110 and the second connection pin 210 of the pin pair M. Based on this, since the overlapping area between the first test pin 111 and the second test pin 211 of the test pin pair Mt (e.g., each test pin pair Mt) is equal to the overlapping area between the first function pin 112 and the second function pin 212 of the function pin pair Mf (e.g., each function pin pair Mf). In this way, the force on the pin row ML in the display module 10 may be uniform when the display module 10 is subjected to the external force, which may reduce the influence of the external force on the portion of the display module in the bonding region.

Positions of the test pin pairs Mt in the pin row ML are not limited in the embodiments of the present disclosure. It will be understood that, the closer the test pin pair Mt is to the function pin pair Mf, the less the difference between the impedance of the test pin pair Mt and the impedance of the function pin pair Mf. An impedance of a test pin pair Mt may be used to characterize impedance(s) of one or more function pin pairs Mf close to the test pin pair Mt. In some embodiments, the plurality of test pin pairs Mt in the pin row ML are symmetrically distributed. In this way, the display module 10 may have a simple structure and is easy to manufacture, which is conducive to improving the yield of products. In addition, since the plurality of test pin pairs Mt in the pin row ML may be symmetrically distributed, the plurality of test pin pairs Mt in the pin row ML may be uniformly distributed. For example, there are test pin pairs Mt respectively located at two ends of the pin row ML, and impedances of the test pin pairs Mt respectively located at the two ends of the pin row ML may be used to characterize the impedances of the function pin pairs Mf in the pin row ML; in addition, since the test pin pairs Mt are respectively arranged at the two ends of the pin row ML, the function pin pairs Mf may be protected to a certain extent. For another example, a middle region of the pin row ML may be provided with test pin pair(s) Mt. For example, the function pin pairs Mf and the test pin pairs Mt in the pin row ML are alternately distributed, and at least one test pin pair Mt (e.g., one or more test pin pairs Mt) may be arranged at an interval of every certain number of function pin pairs Mf (e.g., every K function pin pairs Mf, K being greater than or equal to 1 (K≥1)). Since the test pin pairs Mt in the pin row ML are uniformly distributed, an impedance of a test pin pair Mt of the test pin pairs Mt may be used to characterize impedance(s) of one or more function pin pairs Mf close to the test pin pair Mt. Therefore, the impedance of the test pin pair Mt may characterize the impedance(s) of the one or more function pin pairs Mf more accurately.

Based on the above description, in some embodiments, the number of the function pin pairs Mf is greater than the number of the test pin pairs Mt. In this way, the number of the test pin pairs Mt is small, and the number of the function pin pairs Mf is large. Therefore, it is not only possible to achieve transmissions of various display signals through the function pin pairs Mf, but also possible to detect the impedances of the plurality of function pin pairs Mf by the small number of the test pin pairs Mt. In addition, the number of the function pin pairs Mf may be greater than the number of the first dummy pins 120. Furthermore, the number of the function pin pairs Mf may be greater than the number of the dummy pin pairs N. In this way, the number of the first dummy pins 120 and the number of the dummy pin pairs N may be both small, so that the display apparatus may be further miniaturized on the basis of achieving beneficial effects of the first dummy pins 120 or the dummy pin pairs N. For example, the number of the function pin pairs Mf may be in a range from 60 to 110, such as 60, 65, 70, 75, 80, 85, 90, 95, 100, 105 or 110.

Furthermore, in order to detect the impedances of the test pin pairs Mt, in some embodiments, every two test pin pairs of the plurality of test pin pairs Mt are coupled to each other, so as to constitute a pin group MB. For example, the pin row ML includes two test pin pairs Mt, and the two test pin pairs Mt constitute a pin group MB. For another example, the pin row ML includes more than three test pin pairs Mt (e.g., the number of the more than three test pin pairs Mt is an even number), and every two of the more than three test pin pairs Mt constitute a pin group MB; thus, there are a plurality of pin groups MB. For example, the number of the pin groups MB is 2, 3, 4, 5, 6, 7, 8, 9 or 10.

Figure 10A:
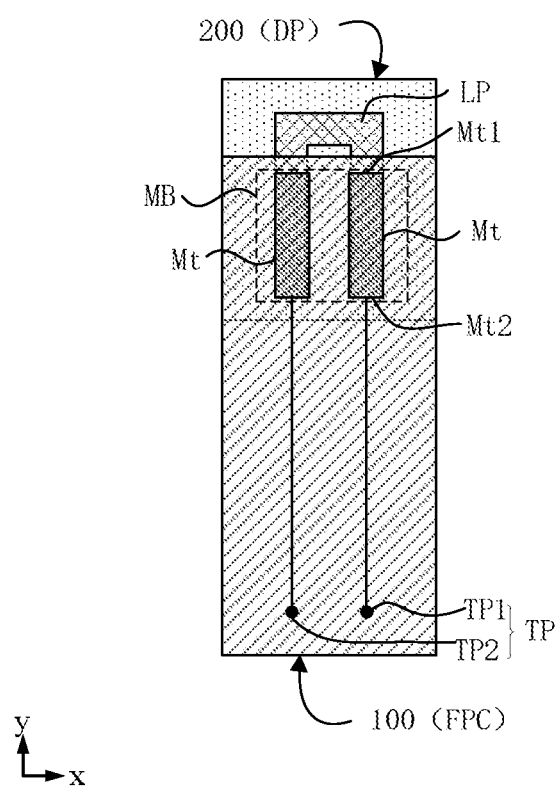
FIG. 10A is a partial enlargement view of the display module in FIG. 2A.
Figure 10B:
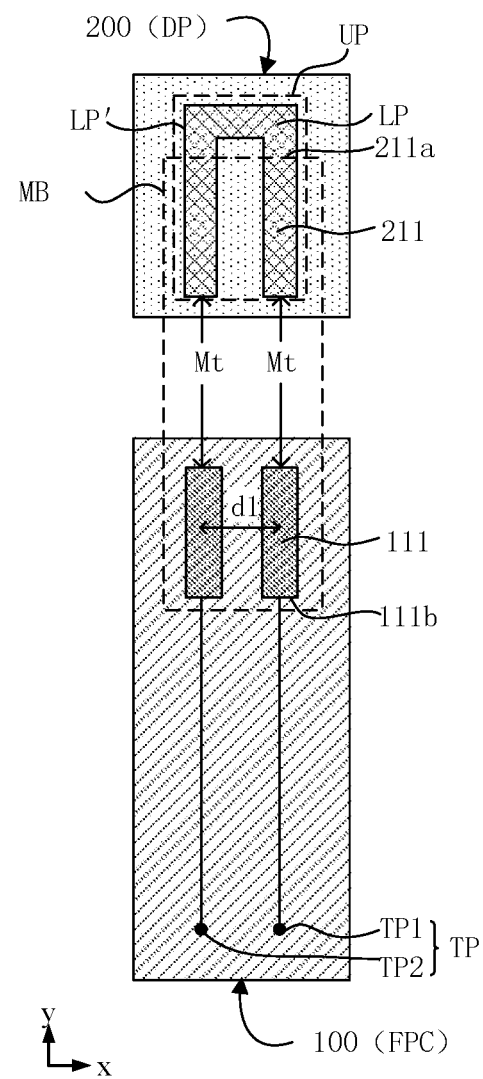
FIG. 10B is another partial enlargement view of the display module in FIG. 2A.

FIG. 10A is a partial enlargement view of the display module provided in the embodiments of the present disclosure, and the structures in FIG. 10A are separated in FIG. 10B for an illustration. It will be noted that, only one pin group and structures related thereto are shown in FIGS. 10A and 10B, and other structures such as the adhesive layer are not shown in FIGS. 10A and 10B. Referring to FIGS. 10A and 10B, the test pin pair Mt may have a first end Mt1 and a second end Mt2 that are opposite to each other. For example, the first end Mt1 and the second end Mt2 are disposed opposite to each other in the second direction.

Referring to FIGS. 10A and 10B, the first bonding component 100 further includes a plurality of test patterns TP. A shape of the test patterns TP is not limited in the embodiments of the present disclosure. For example, the test patterns TP may be circular patterns as shown in FIGS. 10A and 10B. Two test patterns of the plurality of test patterns TP are respectively coupled to second ends Mt2 of two test pin pairs of a pin group MB. That is, a second end Mt2 of a test pin pair is coupled to a test pattern TP. In this way, a signal (e.g., an electrical signal) may be transmitted to the test pin pair Mt and the pin group MB through the test pattern TP. In some possible implementations, a test pattern TP is coupled to a first test pin 111 of a test pin pair Mt. For example, the test pattern TP may be coupled to an end 111b (i.e., an end away from the display region) of the first test pin 111 in the negative direction of the y-axis.

In addition, referring to FIGS. 10A and 10B, the second bonding component 200 further includes at least one connection pattern LP (e.g., one or more connection patterns LP), and a connection pattern LP (e.g., each connection pattern LP) is coupled to first ends Mt1 of the two test pin pairs Mt of the pin group MB. In some possible implementations, the connection pattern LP is coupled to second test pins 211 of the two test pin pairs Mt. For example, the connection pattern LP may be coupled to ends 211a (i.e., ends 211a proximate to the display region) of the two second test pins 211 in the positive direction of the y axis. In this way, the two second test pins 211 of the pin group MB are coupled through the connection pattern LP. The coupling manner of the connection pattern LP and the two second test pins 211 is not limited in the embodiments of the present disclosure. For example, the connection pattern LP may be in contact with the two second test pins 211 of the pin group MB, so as to constitute a one-piece pattern UP. For example, the connection pattern LP and the two second test pins 211 are arranged in a same layer, and constitute the one-piece pattern UP. In this way, a process of manufacturing the connection pattern LP and the second test pins 211 may be simple. For another example, the connection pattern LP may be arranged in a layer different from a layer in which the two second test pins 211 are located, and the connection pattern LP may be coupled to the second test pins 211 through via hole(s).

In addition, in some possible implementations, the connection pattern LP may be in a shape of a broken line or a curved line protruding towards a side thereof away from the second ends Mt2 of the two test pin pairs of the pin group MB. For example, an edge LP' of the connection pattern LP is a protruded broken line or a protruded curved line. The protruded broken line may be a broken line slopes of all segments of the broken line gradually decrease from left to right in the first direction. Similarly, the protruded curved line may be a curved line with a following property: slopes of tangents corresponding to all points on the curved line gradually decrease from left to right in the first direction. Since the connection pattern LP is in the shape of the broken line or the curved line protruding towards the side thereof away from the second ends Mt2 of the two test pin pairs of the pin group MB, at least a portion of the connection pattern LP (e.g., the entire connection pattern LP) may be located on a side of the pin group MB in the second direction. That is, the at least a portion of the connection pattern LP (e.g., the entire connection pattern LP) may be located on a side of the two second test pins 211 in the second direction. Compared with a case where the connection pattern LP is located between the two second test pins 211, in a case where the connection pattern LP is disposed on the side of the two second test pins 211 in the second direction, the process of manufacturing the connection pattern LP may be simpler. For example, in a case where the connection pattern LP and the two second test pins 211 constitute the one-piece pattern UP, since the connection pattern LP is disposed on the side of the two second test pins 211 in the second direction, a shape of the one-piece pattern UP is simple, which facilitates the manufacturing. As a result, the yield of products may be improved.

Since the pin group MB has the above structure, the two test pin pairs Mt of the pin group MB may form a conductive path. For example, the two test pin pairs Mt may be connected in series to form the conductive path. On this basis, the impedance of the test pin pair Mt may be detected by the following method: a first test signal (e.g., an electrical signal) is written into a test pattern (e.g., a test pattern TP1 referring to FIG. 10A) coupled to the pin group MB, and a second test signal output by the pin group MB is received by another test pattern (e.g., a test pattern TP2 referring to FIG. 10A) coupled to the pin group MB. The impedance of the test pin pair Mt of the pin group MB may be obtained by the first test signal and the second test signal. For example, a voltage drop between the test pattern TP1 and the test pattern TP2 may be obtained by the first test signal and the second test signal, so that the resistance of the conductive path of the pin group MB may obtained, and the impedance of the test pin pair M is in turn obtained.

On this basis, the test patterns TP are coupled to the second ends Mt2 of the two test pin pairs of the pin group MB, and the connection pattern LP is coupled to first ends Mt1 of the two test pin pairs of the pin group MB. Therefore, in the conductive path where the two test pin pairs Mt are connected in series, a current may flow through an entire test pin pair Mt. The impedance of the entire test pin pair Mt may be obtained through the impedance test, and the result may be used to characterize an impedance of a function pin pair having a same structure as the test pin pair Mt. Thus, it is conducive to reducing the error of the impedance test.

In some embodiments, referring to FIGS. 8A and 8B, two test pin pairs Mt of a pin group MB (e.g., each pin group MB) are adjacent to each other. That is, in the pin row ML, no other test pin pair Mt is located between the two test pin pairs Mt of the pin group MB, and no function pin pair Mf is located between the two test pin pairs Mt of the pin group MB. A distance between two pin pairs M may influence impedances of the two pin pairs M. For example, in a case where the distance between the two pin pairs M is small, there may be a short circuit between the two pin pairs M. Therefore, impedances of two adjacent pin pairs M need to be detected, so as to control or adjust a distance between two adjacent function pin pairs. The two test pin pairs Mt of the pin group MB may be arranged adjacent to each other. In this way, the impedances of the two adjacent pin pairs M may be detected by detecting an impedance of the pin group MB.

Furthermore, in some possible implementations, referring to FIG. 8B, a distance d1 between two first test pins 111 of a pin group MB is equal to a distance d2 between two adjacent first function pins Mf. A distance between two adjacent connection pins (e.g., two adjacent first test pins or two adjacent first function pins) may be a distance between two centers of the two connection pins. Furthermore, a distance between two pin pairs M (e.g., two test pin pairs Mt, two function pin pairs Mf, or one test pin pair Mt and one function pin pair Mf) may be a distance between two centers of two first connection pins of the two pin pairs M disposed in the first bonding component 100, or may be a distance between two centers of two second connection pins of the two pin pairs M disposed in the second bonding component 200. Since the distance between the two first test pins 111 of the pin group MB is equal to the distance between the two adjacent function pins Mf, a distance between the two test pin pairs Mt of the pin group MB may be equal to the distance between the two adjacent function pin pairs Mf. As described above, the distance between the two pin pairs M may influence the impedances of the two pin pairs M. Therefore, in a case where the distance between the two test pin pairs Mt of the pin group MB is equal to the distance between the two adjacent function pin pairs Mf, the impedance of the test pin pair Mt may be closer to the impedance of the function pin pair Mf. As a result, the error of the bonding impedance test may be reduced.

Figure 11A:
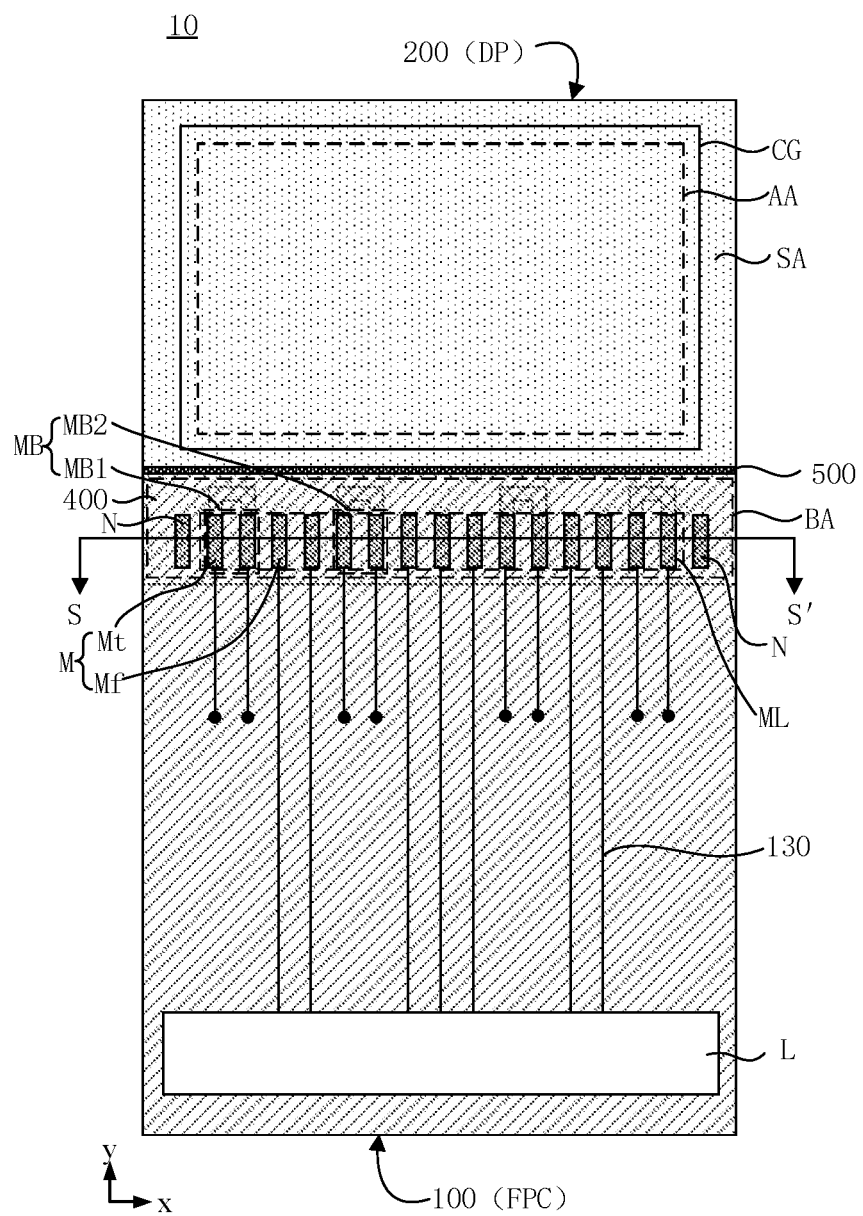
FIG. 11A is a structural diagram of yet another display module, in accordance with some embodiments.
Figure 11B:
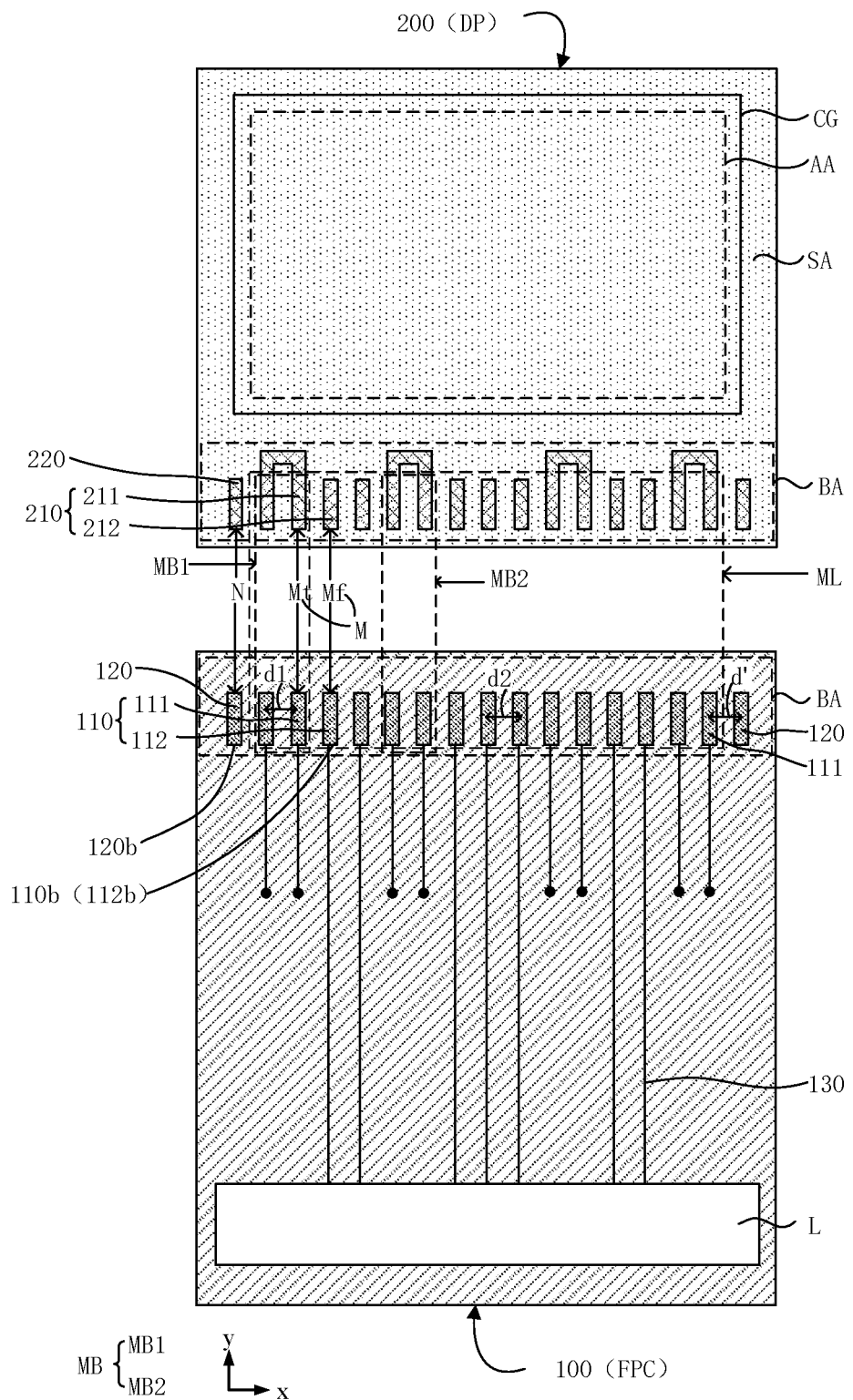
FIG. 11B is a structural diagram of yet another display module, in accordance with some embodiments.

In some embodiments, referring to FIGS. 11A and 11B, the first bonding component and the second bonding component in FIG. 11A are separated in FIG. 11B for an illustration. At least one pin group MB obtained by dividing the plurality of test pin pairs Mt includes a first pin group MB1 and/or a second pin group MB2.

The first pin group MB1 is located on a side of all the function pin pairs Mf of the pin row ML in the first direction. In some possible implementations, the at least one pin group MB includes one first pin group MB1, and the first pin group MB1 is located on a side of all the function pin pairs Mf of the pin row ML in the first direction (e.g., in the positive direction of the x-axis or the negative direction of the x-axis). In some other possible implementations, the at least one pin group MB includes a plurality of first pin groups MB1, and the plurality of first pin groups MB1 are all located on the side of all the function pin pairs Mf of the pin row ML in the first direction (e.g., in the positive direction of the x-axis or the negative direction of the x-axis). In yet some other possible implementations, the at least one pin group MB includes a plurality of first pin groups MB1, and at least one first pin group MB1 (e.g., one or more first pin groups MB1) of the plurality of first pin groups MB1 is located at one of the two sides of all the function pin pairs Mf of the pin row ML in the first direction, and the rest of the plurality of first pin groups MB1 is located on the other of the two sides of all the function pin pairs Mf of the pin row ML in the first direction. For example, as described above, the plurality of test pin pairs Mt may be symmetrically distributed; correspondingly, the plurality of first pin groups MB1 may be symmetrically distributed. For example, each of the two sides of all the function pin pairs Mf of the pin row ML in the first direction is provided with i first pin groups MB1 (where i is greater than or equal to 1 (i≥1), e.g., i=1).

As described above, the pin pair M located at the end of the pin row ML has a poor bonding reliability. Therefore, by providing the first pin group(s) MB1 on the side of all the function pin pairs Mf of the pin row ML in the first direction, that is, by providing the first pin group(s) MB1 on the end of the pin row ML, the function pin pairs Mf may be protected to a certain extent; and the impedance of the pin pair M located on the end of the pin row ML may be detected, so as to evaluate a bonding reliability of each pin pair M.

Furthermore, as described above, the first dummy pin 120 may be disposed on the side of the pin row ML in the first direction. In this way, the first dummy pin 120 may protect the first pin group MB1, and the false connection of the test pin pairs Mt of the first pin group MB1 due to the external force may be ameliorated. Therefore, the impedance of the test pin pair Mt of the first pin group MB1 may be closer to the impedance of the function pin pair Mf. Furthermore, the second dummy pin 220 may be provided to constitute the dummy pin pair N, so as to further protect the first pin group MB1.

In addition, in some embodiments, as shown in FIG. 11B, a distance d' between a first dummy pin 120 and a first test pin 111 that are adjacent to each other is equal to a distance d2 between two adjacent first function pins 112. The distance d' between the first dummy pin 120 and the first test pin 111 may be a distance between a center of the first dummy pin 120 and a center of the first test pin 111. Furthermore, a distance between a dummy pin pair N and a test pin pair Mt may be a distance between a center of a first dummy pin 120 of the dummy pin pair N disposed in the first bonding component 100 and a center of a first test pin 111 of the test pin pair Mt disposed in the first bonding component 100, or may be a distance between a center of a second dummy pin 220 of the dummy pin pair N disposed in the second bonding component 200 and a center of a second test pin 211 of the test pin pair Mt disposed in the second bonding component 200. Since the distance d' between the first dummy pin 120 and the first test pin 111 that are adjacent to each other is equal to the distance d2 between the two adjacent first function pins 112, a distance between a first dummy pin pair N and a test pin pair Mt that are adjacent to each other may be equal to a distance between two adjacent function pin pairs Mf. In some possible implementations, a distance between two adjacent dummy pin pairs N of the dummy pin pairs N, a distance between two pin pairs M of the pin pairs M, and a distance between a dummy pin pair N and a pin pair M that are adjacent to each other of the dummy pin pairs N and the pin pairs M are the same; for example, each distance is in a range from 0.8 mm to 0.12 mm, inclusive. In this way, in the case where the display module 10 is subjected to the external force, the force on the bonding region BA may more uniform. Of course, the above range of a value of a distance is only an example, and shall not limit the value of the distance in this embodiment. For example, the distance may be greater than 0.12 mm, and may be, for example, in a range from 3 mm to 4 mm, inclusive.

With continued reference to FIGS. 11A and 11B, two sides of the second pin group MB2 in the first direction are each provided with a function pin pair Mf. It may also be described as that, the second pin group MB2 may be located in the middle region of the pin row ML.

In some possible implementations, the pin group includes one second pin group MB2, and two sides of the second pin group MB2 in the first direction are each provided with a function pin pair Mf. That is, the second pin group MB2 is located in the middle region of the pin row ML. In some other possible implementations, the pin group includes a plurality of second pin groups MB2. As described above, the plurality of test pin pairs Mt may be symmetrically distributed; correspondingly, the plurality of second pin groups MB2 may be symmetrically distributed. In this way, the plurality of second pin groups MB2 in the pin row ML may be uniformly distributed. For example, in the pin row ML, the function pin pairs Mf and the second pin groups MB2 are alternately distributed, and at least one second pin group MB2 (e.g., one or more second pin groups MB2) may be arranged at an interval of every certain number of function pin pairs Mf (e.g., every K function pin pairs Mf, K being greater than or equal to 1 (K≥1)). It can be understood that, the closer the test pin pair Mt is to the function pin pair Mf, the less the difference between the impedance of the test pin pair Mt and the impedance of the function pin pair Mf. The second pin group MB2 is disposed in the middle region of the pin row ML, so that the impedance of the test pin pair Mt may characterize the impedance of the function pin pair Mf more accurately. Therefore, the error of the bonding impedance test of the display module may be reduced.

In some embodiments, the display module 10 includes a plurality of first dummy pins 120 and a plurality of pin groups MB. The number of function pin pairs Mf between two adjacent first dummy pins of the plurality of first dummy pins 120 is greater than or equal to the number of function pin pairs Mf between two adjacent pin groups of the plurality of pin groups MB. The description that two first dummy pins of the plurality of first dummy pins 120 are adjacent to each other means that, there is no other first dummy pin located between the two first dummy pins. For example, the display module 10 includes two first dummy pins 120 that are respectively located on the two sides of the pin row ML in the first direction; in this case, the two first dummy pins 120 are adjacent to each other. Similarly, the description that two pin groups MB of the plurality of pin groups MB are adjacent to each other means that, there is no other pin group located between the two pin groups. Based on this, since the number of function pin pairs Mf between the two adjacent first dummy pins of the plurality of first dummy pins 120 is greater than or equal to the number of function pin pairs Mf between the two adjacent pin groups of the plurality of pin groups MB, the display module 10 may include two first dummy pins 120 that are respectively located on the two sides of the pin row ML in the first direction. Furthermore, the display module 10 may further include two dummy pin pairs N that are respectively located on the two sides of the pin row ML in the first direction. In this way, there may be a small number of first dummy pins 120 or a small number of dummy pin pairs N, and the size of the display module 10 may be reduced on the basis of achieving the beneficial effects of the first dummy pins 120 or the dummy pin pairs N.

Figure 12:
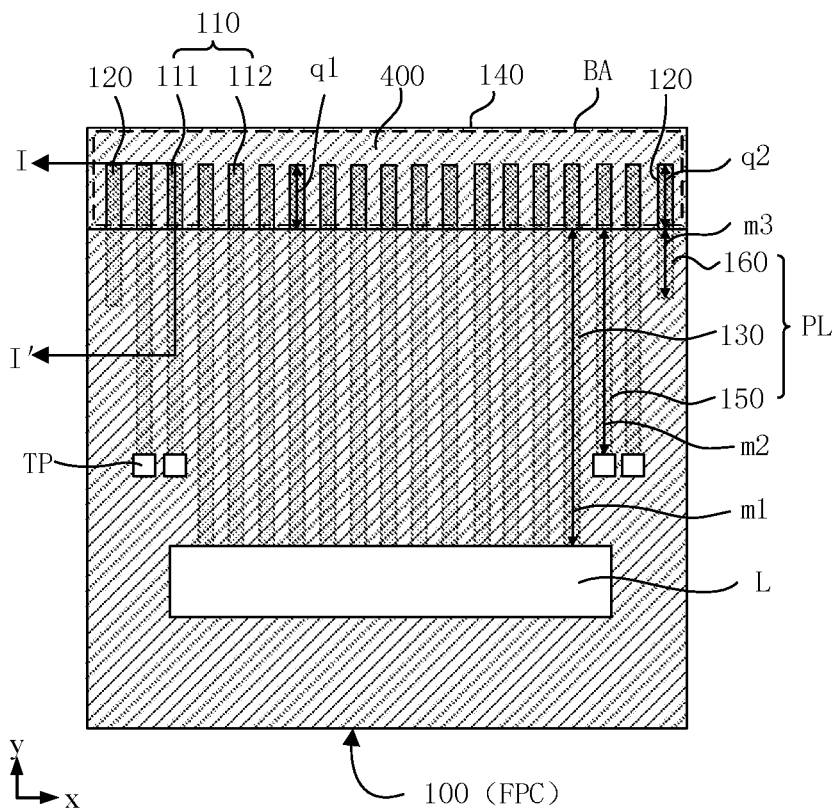
FIG. 12 is a partial enlargement view of the display module in FIG. 8A.
Figure 13:
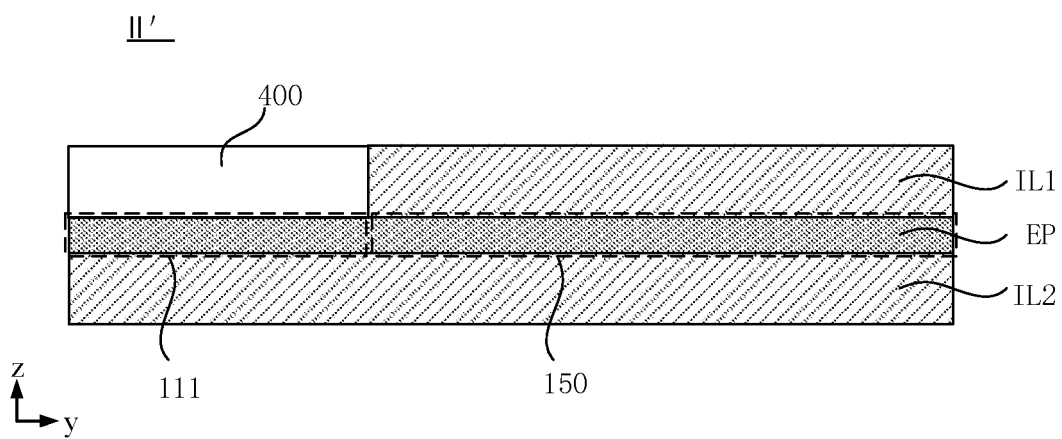
FIG. 13 is a sectional view of the display module in FIG. 12 taken along the section line II'.

In some embodiments, the first bonding component is the FPC. FIG. 12 is a partial enlargement view of the display module in FIG. 8A, and shows structures of the FPC and the adhesive layer of the display module. FIG. 13 is a sectional view of the FPC and the adhesive layer in FIG. 12 taken along the section line II'. Referring to FIGS. 12 and 13, the FPC may include a first insulating layer IL1, a conductive pattern layer EP and a second insulating layer IL2. The first insulating layer IL1, the conductive pattern layer EP and the second insulating layer IL2 are arranged in sequence in a thickness direction of the FPC (e.g., the direction in which the z-axis extends). That is, in the thickness direction of the FPC (e.g., the direction in which the z-axis extends), the conductive pattern layer EP may be located between the first insulating layer IL1 and the second insulating layer IL2.

In some possible implementations, in the FPC, no first insulating layer IL1 is disposed on an end 140 of the FPC in the second direction (e.g., the direction parallel to the y axis). The end 140 is, for example, an end of the FPC close to the display panel. It may also be described as that, the first insulating layer IL1 does not completely cover the conductive pattern layer EP in the second direction. That is, no first insulating layer IL1 is disposed on a portion of the conductive pattern layer EP at the end 140 of the FPC in the second direction. In this way, a portion of the conductive pattern layer EP located at the end 140 is exposed by the first insulating layer IL1, and may be configured to serve as the first connection pins 110 and the second connection pins 120; and another portion of the conductive pattern layer EP covered by the first insulating layer IL1 and the second insulating layer IL2 may be configured to serve as a plurality of connection lines PL. A connection line PL (e.g., each connection line PL) is coupled to a first connection pin 110 or a first dummy pin 120. The plurality of connection lines PL may include the first connection lines 130. As for the first connection lines 130, reference may be made to the above description, which will not be repeated here. In some embodiments, the plurality of connection lines PL may further include a plurality of second connection lines 150. That is, the FPC may further include the plurality of second connection lines 150. A second connection line 150 (e.g., each second connection line 150) is coupled to a first test pin 111.

In some possible implementations, as shown in FIG. 12, a length m1 of a first connection line 130 (e.g., each first connection line 130) is greater than a length m2 of a second connection line 150. Alternatively, the length m1 of the first connection line 130 (e.g., each first connection line 130) is greater than a length q2 of a first dummy pin 120. The length m1 of the first connection line 130 may be a dimension of the first connection line 130 in the second direction (e.g., the direction parallel to the y axis); the length m2 of the second connection line 150 may be a dimension of the second connection line 150 in the second direction; the length q2 of the first dummy pin 120 may be a dimension of the first dummy pin 120 in the second direction. In this way, the length of the second connection line 150 may be relatively small, so that the FPC may has a compact structure. In addition, the length q2 of the first dummy pin 120 may be relatively small. As described above, the first dummy pin 120 is not covered by the first insulating layer IL1. Therefore, in a case where the length q2 of the first dummy pin 120 is relatively small, an area of the first dummy pin 120 exposed by the first insulating layer IL1 may be relatively small. Furthermore, with reference to the above description, in the display module, part or all of a surface of the first dummy pin 120 exposed by the first insulating layer IL1 is covered by the adhesive layer 400. For example, a portion, directly opposite to the second bonding component, of the surface of the first dummy pin 120 exposed by the first insulating layer IL1 is covered by the adhesive layer 400. In a case where the area of the first dummy pin 120 exposed by the first insulating layer IL1 is relatively small, an area of the first dummy pin 120 that is exposed by the first insulating layer IL1 and not covered by the adhesive layer 400 may be relatively small. In this way, a corrosion on the first dummy pin 120 caused by the external environment may be reduced. Furthermore, as shown in FIG. 12, a length q1 of a first connection pin 110 may be equal to the length q2 of the first dummy pin 120. The length q1 of the first connection pin 110 may be a dimension of the first connection pin 110 in the second direction. In this case, similarly, since the length m1 of the first connection line 130 (e.g., each first connection line 130) is greater than the length q1 of the first connection pin 110, the length q1 of the first connection pin 110 may be relatively small, and a corrosion on the first connection pin 110 caused by the external environment may be reduced.

In some embodiments, as shown in FIG. 12, the plurality of connection lines PL may further include at least one third connection line 160 (e.g., one or more third connection lines 160). A third connection line 160 (e.g., each third connection line 160) may be coupled to a first dummy pin 120. The length m1 of the first connection line 130 (e.g., each first connection line 130) is greater than a length m3 of a third connection line 160. The length m3 of the third connection line 160 is a dimension of the third connection line 160 in the second direction (e.g., the direction parallel to the y axis). In this way, the length m3 of the third connection line 160 may be relatively small. No electrical signal may be written into the first dummy pin 120; therefore, in a case where the length m3 of the third connection line 160 is relatively small, the structure of the FPC may be more compact under a premise that the beneficial effects of the first dummy pin 120 are achieved, and the size of the display module may be further reduced.

Figure 14:
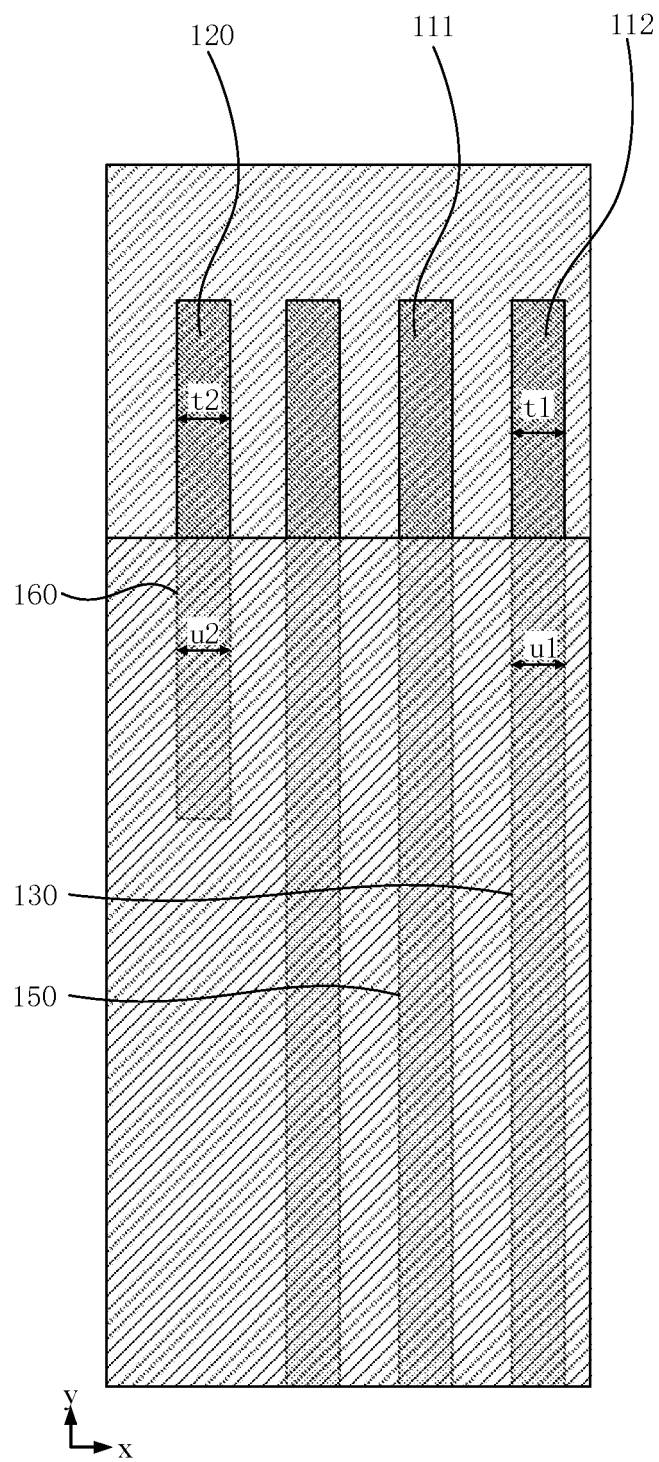
FIG. 14 is a partial enlargement view of the display module in FIG. 12.

Referring to FIG. 14, FIG. 14 is a partial enlargement view of the display module in FIG. 12. In some embodiments, a third connection line 160 and a first dummy pin 120 that are coupled to each other have a same width and constitute a one-piece pattern, and/or a first connection line 130 and a first function pin 112 that are coupled to each other have a same width and constitute a one-piece pattern. A width u1 of the first connection line 130 may be a dimension of the first connection line 130 in the first direction (e.g., the direction parallel to the x axis); a width t1 of the first function pin 112 may be a dimension of the first function pin 112 in the first direction; a width u2 of the third connection line 160 may be a dimension of the third connection line 160 in the first direction; and a width t2 of the first dummy pin 120 may be a dimension of the first dummy pin 120 in the first direction. Based on this, the width u2 of the third connection line 160 is equal to the width t2 of the first dummy pin 120, and the width u1 of the first connection line 130 is equal to the width t1 of the first function pin 112. In this way, the process of manufacturing the FPC is relatively simple, and the yield of products may be improved.

For example, referring to FIGS. 12 and 13, the one-piece pattern constituted by the third connection line 160 and the first dummy pin 120 that are coupled together may be included in the conductive pattern layer EP, and the one-piece pattern may be a strip having a constant width. Similarly, the one-piece pattern constituted by the first connection line 130 and the first function pin 112 may be included in the conductive pattern layer EP, and the one-piece pattern may be a strip having a constant width.

Furthermore, in some embodiments, a second connection line 150 and a first test pin 111 that are coupled to each other have a same width and constitute a one-piece pattern. For example, the one-piece pattern constituted by the second connection line 150 and the first test pin 111 that are coupled to each other may be included in the conductive pattern layer EP, and the one-piece pattern may be a strip having a constant width. In some possible implementations, the plurality of first dummy pins 120 and the plurality of third connection lines 160 constitute a plurality of one-piece patterns. The plurality of first function pins 112 and the plurality of first connection lines 130 constitute a plurality of one-piece patterns. In addition, the plurality of first test pins 111 and the plurality of second connection lines 150 constitute a plurality of one-piece patterns. In addition, each one-piece pattern of the three types of one-piece patterns is a strip having a constant width, and is located in the conductive pattern layer EP. In this way, the process of manufacturing the FPC is relatively simple, and the yield of products may be further improved.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module having a bonding region, the display module comprising:
a first bonding component including a plurality of first test pins and a plurality of first function pins that are disposed in the bonding region and arranged in a first direction; and
a second bonding component including a plurality of second test pins and a plurality of second function pins that are disposed in the bonding region and arranged in the first direction, wherein the plurality of second test pins and the plurality of first test pins are coupled to constitute a plurality of test pin pairs, the plurality of second function pins and the plurality of first function pins are coupled to constitute a plurality of function pin pairs, and the plurality of test pin pairs and the plurality of function pin pairs constitute a pin row;
wherein the first bonding component further includes at least one first dummy pin disposed in the bonding region, and a first dummy pin of the at least one first dummy pin is located on an outer side of the pin row in the first direction.

2. The display module according to claim 1, wherein the second bonding component further includes at least one second dummy pin disposed in the bonding region, and a second dummy pin of the at least one second dummy pin is located on an outer side of the pin row in the first direction.

3. The display module according to claim 1, further comprising:
an adhesive layer disposed in the bonding region, wherein a first test pin of a test pin pair of the plurality of test pin pairs is bonded to a second test pin of the test pin pair by the adhesive layer; a first function pin of a function pin pair of the plurality of function pin pairs is bonded to a second function pin of the function pin pair by the adhesive layer; and the at least one first dummy pin is bonded to the second bonding component by the adhesive layer.

4. The display module according to claim 3, wherein the second bonding component further includes at least one second dummy pin disposed in the bonding region, and a second dummy pin of the at least one second dummy pin is located on an outer side of the pin row in the first direction; and
the at least one second dummy pin is bonded to the first bonding component by the adhesive layer.

5. The display module according to claim 4, wherein the first dummy pin is bonded to the second dummy pin by the adhesive layer, so as to constitute a dummy pin pair.

6. The display module according to claim 5, wherein an overlapping area between the first dummy pin and the second dummy pin of the dummy pin pair is equal to an overlapping area between the first function pin and the second function pin of the function pin pair.

7. The display module according to claim 3, wherein a contact area between the first dummy pin and the adhesive layer is greater than or equal to a contact area of the first function pin and the adhesive layer.

8. The display module according to claim 1, wherein the display module further has a display region, the display region and the bonding region are arranged in a second direction, and the second direction intersects the first direction; and an end of the first dummy pin away from the display region is flush with an end of a first function pin of the plurality of first function pins away from the display region; and/or
an overlapping area between a first test pin and a second test pin of a test pin pair of the plurality of test pin pairs is equal to an overlapping area between a first function pin and a second function pin of a function pin pair of the plurality of function pin pairs.

9. The display module according to claim 1, wherein a number of the plurality of function pin pairs is greater than a number of the plurality of test pin pairs, and is greater than a number of first dummy pins; and/or
the plurality of test pin pairs in the pin row are symmetrically distributed.

10. The display module according to claim 1, wherein every two test pin pairs of the plurality of test pin pairs are coupled to each other to constitute a pin group, and the two test pin pairs of the pin group are adjacent to each other;
the plurality of test pin pairs are divided into at least one pin group, and the at least one pin group includes a first pin group and/or a second pin group;
the first pin group is located on an outer side of all the function pin pairs of the pin row in the first direction, and a function pin pair of the plurality of function pin pairs is arranged on each of two sides of the second pin group in the first direction.

11. The display module according to claim 10, wherein a distance between two first test pins of the pin group is equal to a distance between two adjacent first function pins of the plurality of first function pins.

12. The display module according to claim 10, wherein each test pin pair of the pin group has a first end and a second end that are opposite to each other;
the first bonding component further includes a plurality of test patterns, and two test patterns of the plurality of test patterns are respectively coupled to second ends of the two test pin pairs of the pin group;
the second bonding component further includes at least one connection pattern, and a connection pattern of the at least one connection pattern is coupled to first ends of the two test pin pairs of the pin group.

13. The display module according to claim 12, wherein the connection pattern is coupled to two second test pins of the pin group, so as to constitute a one-piece pattern; and/or
the connection pattern is in a shape of a broken line or a curved line protruding towards a side thereof away from the second ends of the two test pin pairs of the pin group.

14. The display module according to claim 10, wherein the at least one first dummy pin includes a plurality of first dummy pins, and the at least one pin group includes a plurality of pin groups;
a number of function pin pairs located between two adjacent first dummy pins of the plurality of first dummy pins is greater than or equal to a number of function pin pairs located between two adjacent pin groups of the plurality of pin groups.

15. The display module according to claim 1, wherein a distance between a first dummy pin of the at least one first dummy pin and a first test pin of the plurality of first test pins that are adjacent to each other is equal to a distance between two adjacent first function pins of the plurality of first function pins.

16. The display module according to claim 1, wherein the first bonding component is a flexible printed circuit, and the flexible printed circuit further includes a plurality of first connection lines; the second bonding component is a display panel; and the display module further includes a connector, and the connector is coupled to the plurality of first function pins through the plurality of first connection lines; or
the first bonding component is the flexible printed circuit, and the flexible printed circuit further includes the plurality of first connection lines and a plurality of second connection lines; the second bonding component is the display panel; the display module further includes the connector, and the connector is coupled to the plurality of first function pins through the plurality of first connection lines; a second connection line of the plurality of second connection lines is coupled to a first test pin of the plurality of first test pins; and a length of a first connection line of the plurality of first connection lines is greater than a length of the second connection line or a length of the first dummy pin.

17. The display module according to claim 16, wherein the flexible printed circuit further includes:
- at least one third connection line, wherein a third connection line of the at least one third connection line is coupled to a first dummy pin; and
- the length of the first connection line is greater than a length of the third connection line.

18. The display module according to claim 17, wherein
- the third connection line and the first dummy pin that are coupled to each other have a same width and constitute a one-piece pattern; and/or
- a first connection line of the plurality of first connection lines and a first function pin of the plurality of first function pins that are coupled to each other have a same width and constitute another one-piece pattern.

19. The display module according to claim 16, wherein the display panel is a silicon-based display panel.

20. A display apparatus, comprising the display module according to claim 1.

\* \* \* \* \*